US008445832B2

(12) United States Patent
Takemoto et al.

(10) Patent No.: US 8,445,832 B2
(45) Date of Patent: May 21, 2013

(54) OPTICAL COMMUNICATION DEVICE

(75) Inventors: Takashi Takemoto, Fuchu (JP); Hiroki Yamashita, Hachioji (JP); Tatsuya Saito, Kunitachi (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 13/201,212

(22) PCT Filed: Mar. 5, 2009

(86) PCT No.: PCT/JP2009/054172
§ 371 (c)(1),
(2), (4) Date: Aug. 11, 2011

(87) PCT Pub. No.: WO2010/100741
PCT Pub. Date: Sep. 10, 2010

(65) Prior Publication Data
US 2011/0316632 A1    Dec. 29, 2011

(51) Int. Cl.
*H03F 3/08* (2006.01)
*H01J 43/00* (2006.01)
*H01J 40/14* (2006.01)
*G01R 19/00* (2006.01)

(52) U.S. Cl.
USPC ............. 250/214 A; 250/214 LA; 250/214 R; 330/308; 327/51

(58) Field of Classification Search
USPC .............. 250/214 A, 214 LA, 214 R, 214 LS, 250/214.1; 330/84–88, 308; 327/51, 52, 54
See application file for complete search history.

(56) References Cited

U.S. PATENT DOCUMENTS

| 4,859,928 A | 8/1989 | Etheridge |
| 5,434,426 A | 7/1995 | Furuyama et al. |

(Continued)

FOREIGN PATENT DOCUMENTS

| JP | 62-051812 A | 3/1987 |
| JP | 1-192207 A | 8/1989 |

(Continued)

OTHER PUBLICATIONS

Chih-Fan Liao, et al., "40 Gb/s Transimpedance-AGC Amplifier and CDR Circuit for Broadband Data Receivers in 90 nm CMOS", IEEE Journal of Solid-State Circuits, vol. 43, No. 3, Mar. 2008, p. 642-655.

(Continued)

*Primary Examiner* — Que T Le
*Assistant Examiner* — Don Williams
(74) *Attorney, Agent, or Firm* — Miles & Stockbridge P.C.

(57) ABSTRACT

An optical communication device which can be operated at high speed is provided. For example, the optical communication device includes: a pre-amplifier circuit PREAMP1 amplifying a current signal Iin from a photodiode PD, and converting an amplified signal into a voltage signal; and an operating-point controller circuit VTCTL1 controlling an operation of the PREAMP1. The PREAMP1 includes a negative feedback path formed by a feedback resistance Rf1, and includes: a level-shift circuit LS1 level-shifting in accordance with an operating-point control signal Vcon; and an amplifier circuit AMP1 connected to a subsequent stage of the LS1 and performing an amplifying operation with a high gain. The VTCTL1 includes a replica circuit configured by the same circuit and circuit parameter as those of the AMP1 and electrically connected between the input and the output, and generates the Vcon so that an output DC level of this replica circuit is matched with an input DC level of the AMP1.

14 Claims, 16 Drawing Sheets

U.S. PATENT DOCUMENTS

| | | | |
|---|---|---|---|
| 5,679,953 A | * | 10/1997 | Ananth et al. ............. 250/338.1 |
| 5,818,260 A | | 10/1998 | Kuo |
| 2004/0173729 A1 | | 9/2004 | Shimizu et al. |

FOREIGN PATENT DOCUMENTS

| | | |
|---|---|---|
| JP | 3-121512 A | 5/1991 |
| JP | 6-097404 A | 4/1994 |
| JP | 6-204761 A | 7/1994 |
| JP | 7-094953 A | 4/1995 |
| JP | 7-135489 A | 5/1995 |
| JP | 8-265065 A | 10/1996 |
| JP | 10-117137 A | 5/1998 |
| JP | 11-205047 A | 7/1999 |
| JP | 2002-076793 A | 3/2002 |
| JP | 2002-141758 A | 5/2002 |
| JP | 2003-198297 A | 7/2003 |
| JP | 2004-274109 A | 9/2004 |
| JP | 2006-261866 A | 9/2006 |
| JP | 2007-336476 A | 12/2007 |

OTHER PUBLICATIONS

C. Kromer, et al., "A 40 Gb/s Optical Receiver in 80-nm CMOS for Short-Distance High-Density Interconnects", IEEE Asian Solid-State Circuits Conference 2006 (ASSCC 2006), Nov. 2006, p. 395-398.

Office Action issued Oct. 30, 2012, in Japanese Patent Application No. 2011-502544.

* cited by examiner

OPTICAL COMMUNICATION DEVICE

TECHNICAL FIELD

The present invention relates to an optical communication device, and more particularly, the present invention relates to a technique effectively applied to an optical communication device including a transimpedance amplifier (TIA).

BACKGROUND ART

For example, each of FIGS. 4 and 5 of Non-Patent Document 1 shows an amplifier circuit and a TIA having a negative feedback configuration including a feedback resistance between an input and an output of this amplifier circuit. In FIG. 5, this amplifier circuit is configured by three stages formed of a grounded-gate amplifier stage, a grounded-source amplifier stage, and a source follower stage. Also, FIG. 4 shows a method of setting a circuit parameter for decreasing noise in the grounded-gate amplifier stage, and FIG. 5 shows a system of enhancing a bandwidth by using an inductance for a load element of the grounded-gate amplifier stage or the grounded-source amplifier stage.

FIG. 2 of Non-Patent Document 2 shows a TIA having an open-loop configuration. This TIA has a configuration including amplifier stages formed of a grounded-gate amplifier stage in an initial stage and a grounded-source amplifier stage and the grounded-gate amplifier stage in a latter stage, in which the grounded-gate amplifier stage in the latter stage is gain-boosted by the grounded-source amplifier stage. Each MOS transistor is formed so as to have a large gate width, so that its bandwidth is improved.

Non-Patent Document 1: Chih-Fan Liao, Shen-Iuan Liu "40 Gb/s Transimpedance-AGC Amplifier and CDR Circuit for Broadband Data Receivers in 90 nm CMOS", IEEE Journal of Solid-State Circuits, Vol. 43, No. 3, March 2008, p. 642-648

Non-Patent Document 2: C. Kromer and other five, "A 40 Gb/s Optical Receiver in 80-nm CMOS for Short-Distance High-Density Interconnects", IEEE Asian Solid-State Circuits Conference 2006 (ASSCC 2006), November 2006, p. 395-398

DISCLOSURE OF THE INVENTION

Problems to be Solved by the Invention

FIG. 16 is a schematic diagram showing a configuration example of an optical communication device studied as an assumption of the present invention. The optical communication device shown in FIG. 16 is configured by: a pre-amplifier circuit PREAMP_C for amplifying a current signal from a photodiode PD which is generated by an optical input and converting the current signal into a voltage signal; a post-amplifier circuit PSAMP for amplifying an output of the pre-amplifier circuit; and a limit amplifier circuit LMTAMP for further amplifying an output of the post-amplifier circuit. More particularly, although not limited, the PREAMP_C converts a current signal of several tens to several hundreds of μA into a voltage signal of about 10 mV, the PSAMP receives the voltage signal and generates a voltage signal of 200 mV to 300 mV, and the LMTAMP receives the voltage signal and generates a voltage signal of about 500 mV. The LMTAMP is a circuit for amplifying the voltage signal up to a logic level of a latter-stage logic circuit (for example, CDR (Clock Data Recovery) circuit or others) not shown.

Since the current signal inputted to the PD is minute as described above, and since communications exceeding several tens of Gbps have been performed in recent years, a low noise characteristic in addition to a high gain characteristic (for example, about 50 dB) and a high speed performance is particularly important in the PREAMP_C. In the PSAMP, if it can obtain a sufficient input voltage signal through the PREAMP_C, it is required to put a priority on the high speed performance higher than the gain (for example, about 20 dB), the low noise characteristic, and others. For example, a bandwidth of about 4/3 times that of the PREAMP_C is preferred. Note that, in FIG. 16, the PREAMP_C is an amplifier circuit having a single input/output, and the PSAMP is an amplifier circuit having a differential input/output, and therefore, a voltage reference generator circuit VREFG for generating a reference voltage is provided at one end of the PSAMP. The VREFG can be achieved by, for example, detecting a DC component by a low pass filter for the output of the PREAMP_C or others. However, in this case, there is a concern of area increase.

FIGS. 17A to 17C are explanatory diagrams each showing a detail of the pre-amplifier circuit PREAMP_C in FIG. 16. As shown in FIG. 17A, the PREAMP_C is a negative feedback circuit including: an amplifier circuit AMP_C with a negative gain (G); and a feedback resistance Rf connected between an input and an output of the amplifier circuit. When an input capacitance in such a PREAMP_C is assumed as "Cin", its transimpedance is almost expressed "G/(1+G)× Rf", and a high-band cut-off frequency is expressed as "G/(2π·Rf·Cin)" as shown in FIG. 17B. Therefore, when the gain (G) is increased, the bandwidth can be enhanced.

Here, in order to increase the gain (G), it can be considered to, for example, provide a plurality of amplifier stages (grounded-gate amplifier stage and grounded-source amplifier stage) as disclosed in Non-Patent Document 1. However, an amount of the noise is generally increased by increasing the number of amplifier stages. Also, when the initial stage is the grounded-gate amplifier stage, although there is a merit that an input impedance can be decreased, a sensitivity to the noise is particularly increased.

Accordingly, it can be considered to use, for example, an amplifier circuit having one stage configuration whose gain is extremely high. However, due to the high gain, it is difficult to accurately determine an operating point of the gain as shown in FIG. 17C. FIG. 17C shows a characteristic example of an input voltage Vi and an output voltage Vo of the AMP_C, and the high gain means that its slope (Vo/Vi) is steep. In this case, also when, for example, the operating point is slightly shifted from a design value due to process variation or others, the gain is significantly changed, and therefore, there is a concern of not obtaining a predetermined performance.

On the other hand, when, for example, the amplifier circuit having the open-loop configuration disclosed in Non-Patent Document 2 is used, a low input impedance (resulting in the improvement of the bandwidth) can be achieved by the grounded-gate stage in the initial stage despite a noise problem, and the improvement of the gain (also contributing to the improvement of the bandwidth) can be achieved by the amplifier stage in the latter stage. However, in the configuration of this Non-Patent Document 2, each MOS transistor is configured by a large gate width, and therefore, there is a concern of limitation of the bandwidth due to a parasitic capacitance inside a circuit.

The present invention has been made in consideration of such a problem, and one of a preferred aims of the invention is to provide an optical communication device which can be operated at high speed. The above and other preferred aims and novel characteristics of the present invention will be apparent from the description of the present specification and the accompanying drawings.

Means for Solving the Problems

The typical ones of the inventions disclosed in the present application will be briefly described as follows.

An optical communication device according to the present embodiment includes: a pre-amplifier circuit for amplifying a current signal from a photodiode and converting it into a voltage signal; and an operating-point controller circuit for controlling the pre-amplifier circuit. The pre-amplifier circuit has a negative feedback configuration including a feedback path including: an amplification path; and a feedback resistance. The amplification path includes: a first level-shift circuit; and a first amplifier circuit connected to a latter stage of the first level-shift circuit. The first level-shift circuit performs a level-shift operation in accordance with a first control signal from the operating-point controller circuit. The operating-point controller circuit includes a replica circuit which is configured by the same circuit and circuit parameter as those of the first amplifier circuit, and besides, whose input and output are electrically connected to each other, and generates the first control signal so that a direct-current voltage level of an output signal from the replica circuit is matched with a direct-current voltage level of an input signal of the first amplifier circuit.

By using such a configuration, a logical threshold voltage obtained from the output of the replica circuit can be set as the operating point of the first amplifier circuit, and, by this setting, the first amplifier circuit can be stably operated at a high gain. As a result, a high frequency bandwidth of the pre-amplifier circuit having the negative feedback configuration is enhanced, so that the high speed performance of the optical communication device can be achieved.

Here, in addition to the replica circuit, the operating-point controller circuit includes, for example: a first current source for generating the same direct current as a direct current level of a current signal from a photodiode; a replica pre-amplifier circuit; and a second amplifier circuit. The replica pre-amplifier circuit is configured by the same circuit and circuit parameter as those of the pre-amplifier circuit, and performs an amplification operation with taking the direct current from the first current source as its input. The second amplifier circuit performs a differential amplification between an input signal of the first amplifier circuit in the replica pre-amplifier circuit and an output signal of the replica circuit, and outputs the first control signal. And, each first level-shift circuit in the pre-amplifier circuit and the replica pre-amplifier circuit receives the first control signal, and performs the level-shift operation.

In this manner, by generating the first control signal with using the operating-point controller circuit simulating a DC-like operation of the pre-amplifier circuit, the operating point of the first amplifier circuit in the pre-amplifier circuit can be always stably determined. As a result, the high speed performance of the optical communication device can be achieved. Further, the output of the replica pre-amplifier circuit can be also used as a reference signal of a post-amplifier circuit which is generally provided in the latter stage of the pre-amplifier circuit. That is, the post-amplifier circuit performs a differential amplification for the output signal from the pre-amplifier circuit with taking this reference signal as a reference. In this manner, a circuit (for example, a low pass filter) generating this reference signal is not separately required. Still further, a voltage level of this reference signal becomes an optimum value (center of output voltage magnitude of the pre-amplifier circuit), and therefore, the high speed performance of the post-amplifier circuit can be also achieved.

Effects of the Invention

An effect obtained by a typical embodiment of the invention disclosed in the present application is briefly summarized that the high speed performance of the optical communication device can be achieved.

BRIEF DESCRIPTIONS OF THE DRAWINGS

SYMBOL EXPLANATION

Figure 1:
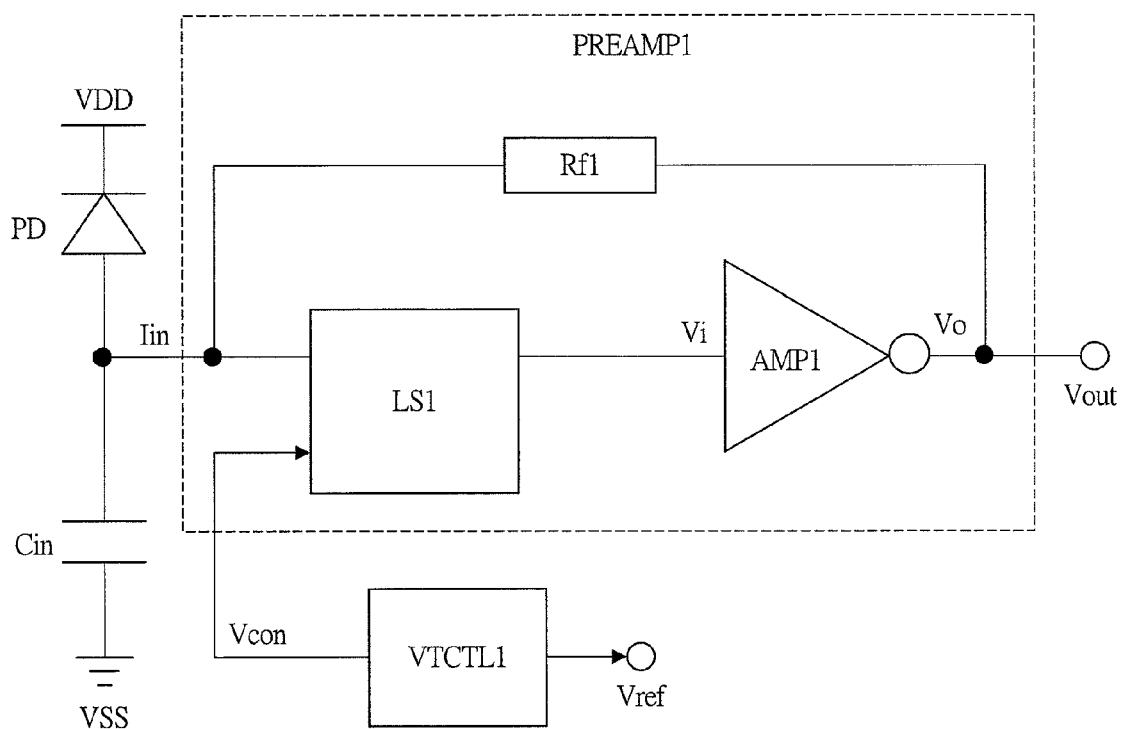
FIG. 1 is a block diagram showing a configuration example of a principal unit in an optical communication device according to a first embodiment of the present invention.

AMP amplifier circuit
Cin input capacitance
Cos capacitance
DRV output driver circuit
IS constant current source
ISV variable current source
L inductor
LMTAMP limit amplifier circuit
LS level-shift circuit
MN NMOS transistor
MP PMOS transistor
OSCTL offset control circuit
PD photodiode
PREAMP pre-amplifier circuit
PSAMP post-amplifier circuit
R, Ros resistance
REP replica circuit
Rf feedback resistance
VDD, VCC power-supply voltage
VREFG voltage-reference generator circuit
VREG regulator circuit
VSS ground voltage
VTCTL operating-point control signal
Vc operating-point correction signal
Vcon operating-point control signal
Vos offset voltage
Vref reference voltage

BEST MODE FOR CARRYING OUT THE INVENTION

In the embodiments described below, the invention will be described in a plurality of sections or embodiments when required as a matter of convenience. However, these sections or embodiments are not irrelevant to each other unless otherwise stated, and the one relates to the entire or a part of the other as a modification example, details, or a supplementary explanation thereof. Also, in the embodiments described below, when referring to the number of elements (including number of pieces, values, amount, range, and the like), the number of the elements is not limited to a specific number unless otherwise stated or except the case where the number is apparently limited to a specific number in principle. The number larger or smaller than the specified number is also applicable.

Further, in the embodiments described below, it goes without saying that the components (including element steps) are not always indispensable unless otherwise stated or except the case where the components are apparently indispensable in principle. Similarly, in the embodiments described below, when the shape of the components, positional relation thereof, and the like are mentioned, the substantially approximate and similar shapes and the like are included therein unless otherwise stated or except the case where it is conceivable that they are apparently excluded in principle. The same goes for the numerical value and the range described above.

Still further, a circuit element configuring each functional block of the embodiments is not particularly limited. However, the circuit element is formed on a semiconductor substrate such as monocrystalline silicon by an integrated circuit technique such as CMOS (complementary MOS transistor) which is publicly known. Note that, in the embodiments, a MOS (Metal Oxide Semiconductor) transistor is used as one example of a MISFET (Metal Insulator Semiconductor Field Effect Transistor). In the diagrams, a P-channel type MOS transistor (PMOS transistor) is distinguished from an N-channel type MOS transistor (NMOS transistor) by attaching a circle mark on a gate of the P-channel type MOS transistor. In the diagrams, a connection of a substrate potential of the MOS transistor is not particularly mentioned. However, as long as the connection is within a scope that the MOS transistor can be normally operated, a method of the connection is not particularly limited.

Hereinafter, the embodiments of the present invention will be described in detail with reference to the accompanying diagrams. Note that components having the same function are denoted by the same reference symbols in principle throughout the diagrams for describing the embodiments, and the repetitive description thereof will be omitted.

First Embodiment

FIG. 1 is a block diagram showing a configuration example of a principal unit in an optical communication device according to a first embodiment of the present invention. An optical communication device shown in FIG. 1 is configured by: a pre-amplifier circuit PREAMP1 which receives a current signal Iin from a photodiode PD generated by an optical input, and amplifies and converts the current signal into a voltage signal; and an operating-point controller circuit VTCTL1. The PREAMP 1 is applied instead of a pre-amplifier circuit PREAMP_C shown in FIG. 16.

The PREAMP1 is a transimpedance amplifier (TIA) having a negative feedback configuration, and is configured by: a level-shift circuit LS1; an amplifier circuit AMP1 whose input is an output of the level-shift circuit and which has a negative gain; and a feedback resistance Rf1 connected between an output of the AMP1 and an input of the LS1. The current signal Iin from the PD is converted into a voltage signal via the Rf1, and voltage signals generated at one end of the Rf1 and an output node Vout which is an output of the AMP1 are expressed nearly as "Iin×Rf1" when a gain of the AMP1 is high.

The AMP1 is configured by one amplifier stage whose gain (output voltage signal Vo/input voltage signal Vi) is designed to an extremely large value. In this manner, as described in FIGS. 16 to 17C, the low noise characteristic and the high speed performance can be achieved. However, as shown in FIG. 17C, if the operating point of the AMP1 is shifted due to process variation or others, a desired gain cannot be obtained, and therefore, there is a concern of preventing the high speed performance of the PREAMP1.

Accordingly, the VTCTL1 is provided. The VTCTL1 includes a replica circuit having the same circuit configuration and element parameter as those of the AMP1 although their details will be described later, and an operating-point control signal Vcon for determining the operating point of the AMP1 is generated by using this replica circuit. The LS1 is typically configured by a source follower circuit which level-shifts a DC level contained in an extremely-minute voltage signal generated by the Iin in accordance with the Vcon, and outputs the level-shifted signal to the AMP1. In this manner, the operating point of the AMP1 is determined to an optimal value through this level shift, and, as a result, the desired gain can be obtained in the AMP1, and besides, the high speed performance of the PREAMP1 can be achieved. Also, by configuring the LS1 by a gate-input transistor such as the source follower circuit, the low noise characteristic can be achieved. Note that the VTCTL1 also generates a reference voltage Vref to be a DC component of an output signal in the output node Vout in addition to the Vcon although its detail will be described later.

Figure 2:
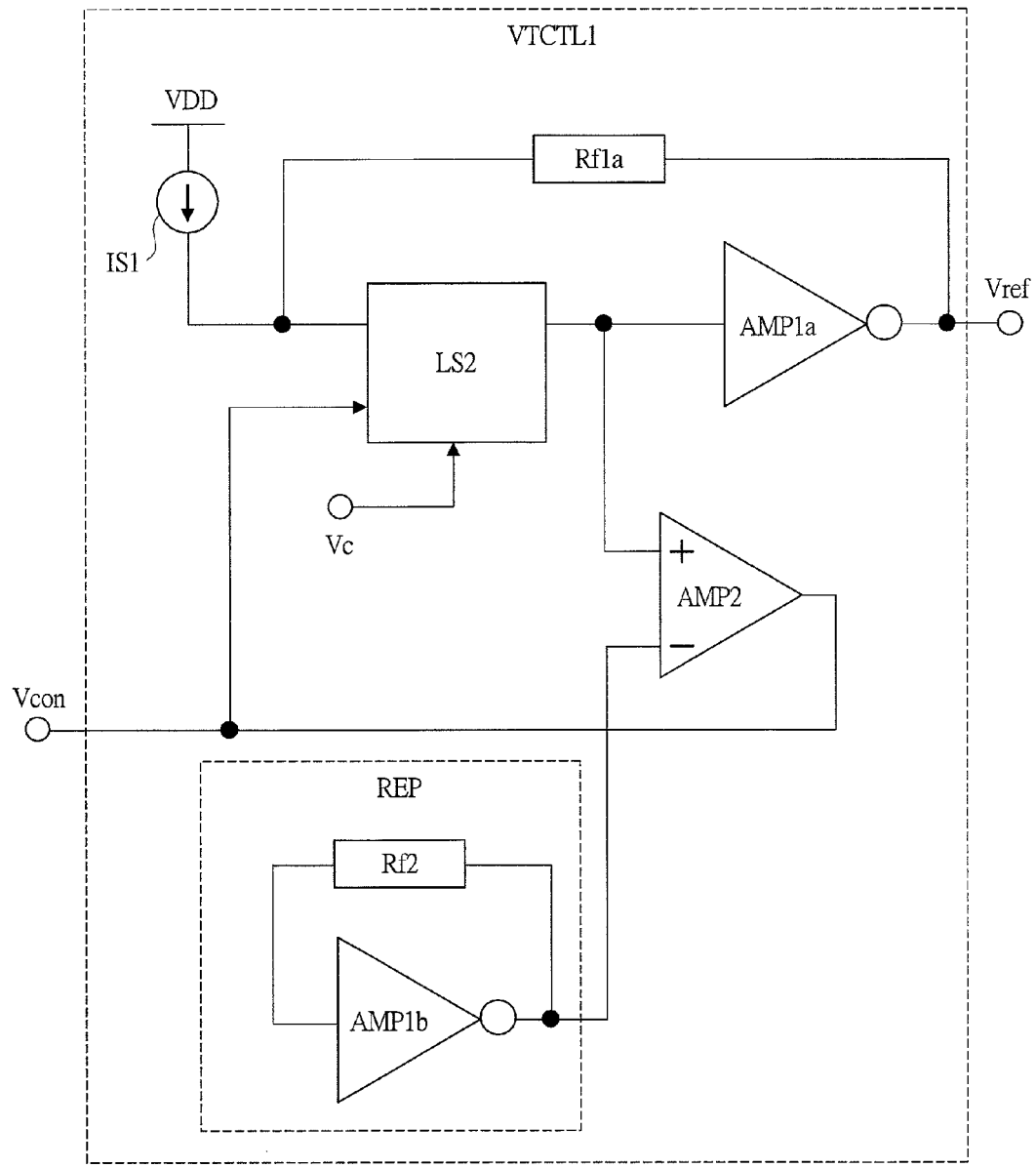
FIG. 2 is a block diagram showing a configuration example of an operating-point controller circuit in the optical communication device of FIG. 1.

FIG. 2 is a block diagram showing a configuration example of the operating-point controller circuit VTCTL1 in the optical communication device of FIG. 1. The operating-point controller circuit VTCTL1 shown in FIG. 2 includes: a constant current source IS1 to be a circuit reflecting the photodiode PD of FIG. 1; and a level-shift circuit LS2, an amplifier circuit AMP1a, and a feedback resistance Rf1a, to be a replica amplifier circuit reflecting the pre-amplifier circuit PREAMP1 of FIG. 1, and besides, includes: an amplifier circuit AMP2; and a replica circuit REP. A connection relation among the IS1, the LS2, the AMP1a, and the Rf1a of FIG. 2 is the same as a connection relation among the PD, the LS1, the AMP1, and the RF1 of FIG. 1. The AMP1a and the Rf1a are configured by the same circuit (also including the circuit parameter) as those of the AMP1 and the Rf1 in the PREAMP1 of FIG. 1. The IS1 generates the same current as a DC current of the PD in FIG. 1.

The replica circuit REP includes: an amplifier circuit AMP1b to be the same circuit (also including the circuit parameter) as those of the AMP1 of FIG. 1 and the AMP1a of FIG. 2; and a feedback resistance Rf2 connected between an input and an output of the amplifier circuit. The Rf2 is for preventing the oscillation of the AMP1b and electrically shorting between the input and the output of the AMP1b. By such a configuration, the output of the AMP1b is converged to its logical threshold level. The AMP2 performs a differential amplifying operation with taking the output of this AMP1b as a (−) input and the output of the LS2 (input of the AMP1a) as a (+) input, and outputs the operating-point control signal Vcon. This Vcon is outputted to the LS1 of the PREAMP1 of FIG. 1, and besides, is outputted to the LS2 of FIG. 2.

The LS2 is configured by the nearly same circuit (also including the circuit parameter) as those of the LS1 of the PREAMP1 of FIG. 1, and level-shifts a DC voltage signal generated by the IS1 based on the Vcon and outputs the level-shifted signal to the AMP1a and the AMP2. The AMP2 has a sufficiently large gain, and generates the operating-point control signal Vcon to be a value such as matching an input voltage level to the AMP1a with a logical threshold level of an output from the AMP1a by the feedback via this LS2. And, this Vcon is supplied to the LS1 in the PREAMP1 of FIG. 1, and, as a result, an input voltage signal Vi to the AMP1 in the PREAMP1 is also matched with a logical threshold level from the AMP1b of FIG. 2. Therefore, the AMP1 performs an amplifying operation with taking a logical threshold level with a high gain as the operating point, and therefore, the high speed performance of the PREAMP1 can be achieved as described above.

Note that a difference point between the LS2 of FIG. 2 and the LS1 of FIG. 1 is that the LS2 can correct a level-shift amount even by an operating-point correction signal Vc. The AMP1, the AMP1a, and the AMP1b are the same circuit as each other, and, when they are formed on the same semiconductor chip, they are normally affected by the same process variation, and therefore, the operating-point correction signal Vc is not always provided. However, for example, when a degree of the variation is different from each other, the correction can be also performed by the Vc. Also, the output of the AMP1a of FIG. 2 is used as the above-described reference voltage Vref.

Figure 3:
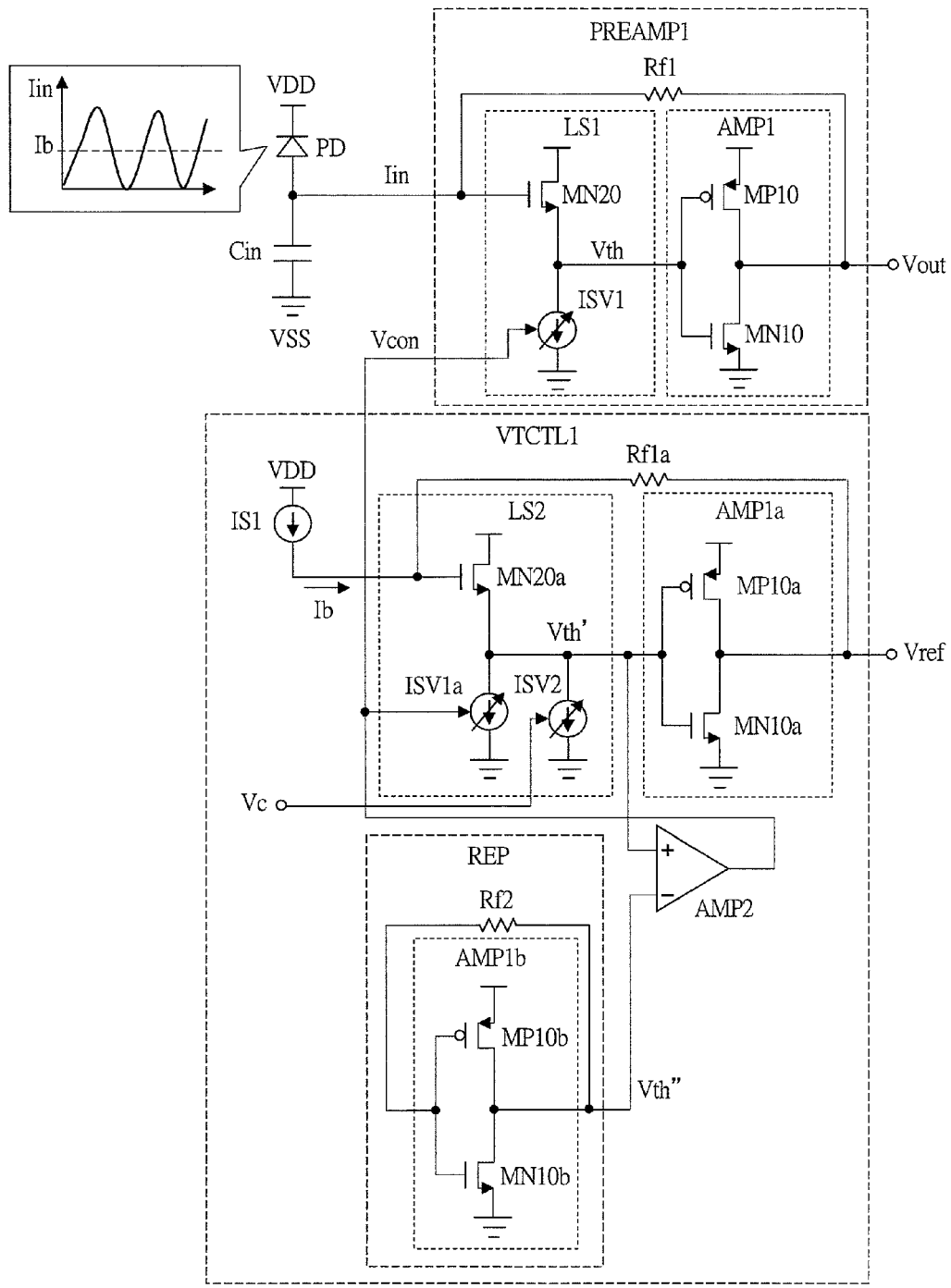
FIG. 3 is a circuit diagram showing a detailed configuration example in an optical communication device including configurations of FIGS. 1 and 2.

FIG. 3 is a circuit diagram showing a detailed configuration example in an optical communication device including configurations of FIGS. 1 and 2. In the pre-amplifier circuit PREAMP1 of FIG. 3, the level-shift circuit LS1 is a source follower circuit including: an NMOS transistor MN20; and a variable current source ISV1 connected to a source of the MN20. To a gate of the MN20, the photodiode PD and the feedback resistance Rf1 are connected in parallel, and an output signal Vth is outputted from the source thereof. In the ISV1, its current value is controlled in accordance with the operating-point control signal Vcon, and the DC level of the Vth is controlled in accordance with the controlled current value. The amplifier circuit AMP1 is configured by a CMOS inverter circuit including a PMOS transistor MP10 and an NMOS transistor MN10, and is operated with taking the Vth from the LS1 as an input. The output of the AMP1 is connected to the output node Vout, and besides, is connected to a gate of the MN20 via the feedback resistance Rf1.

In the operating-point controller circuit VTCTL1 of FIG. 3, the level-shift circuit LS2 is a source follower circuit including an NMOS transistor MN20a and two variable current sources ISV1a and ISV2 connected to a source of the MN20a. The MN20a includes the same circuit parameter as that of the MN20, and a gate of the MN20a is connected in parallel to the constant current source IS1 and the feedback resistance Rf1a, and a source thereof outputs an output signal Vth'. As shown in FIG. 3, the IS1 is set to a current value Ib of the DC level in the current signal Iin of the PD. The ISV1a includes the same circuit parameter as that of the ISV1, a current value of the ISV1a is controlled in accordance with the Vcon, and the DC level of the Vth' is controlled in accordance with this controlled current value. A current value of the ISV2 is controlled in accordance with the operating-point correction signal Vc, and the DC level of the Vth' is finely adjusted.

The amplifier circuit AMP1a is configured by a CMOS inverter circuit including a PMOS transistor MP10a and an NMOS transistor MN10a, and is configured by the same circuit parameter as that of the CMOS inverter circuit of the AMP1. The AMP1a is operated with taking the Vth' from the LS2 as its input to input the reference voltage Vref which is its output to a gate of the MN20a via the feedback resistance Rf1a. The replica circuit REP is configured by: the CMOS inverter circuit including a PMOS transistor MP10b and an NMOS transistor MN10b; and a feedback resistance Rf2 connected between an input and an output of the CMOS inverter circuit. This CMOS inverter circuit is configured by the same circuit parameter as that of the CMOS inverter circuit of the AMP1. The AMP2 takes an output signal Vth" from the CMOS inverter circuit of the REP and the output signal Vth' from the LS2 as its input, and outputs the control signal Vcon.

As shown in FIG. 3, by configuring the amplifier circuit AMP1 in the pre-amplifier circuit PREAMP1 by a one-stage CMOS inverter circuit, the high gain and the low noise characteristics can be achieved. Also, by configuring the level-shift circuit LS1 in the PREAMP1 by the source follower circuit, the low noise characteristic can be also achieved. Therefore, as described above, by appropriately determining the operating point of the AMP1 with using the operating-point controller circuit VTCTL1, the high speed performance and the low noise characteristic of the pre-amplifier circuit can be achieved.

Figure 4A:
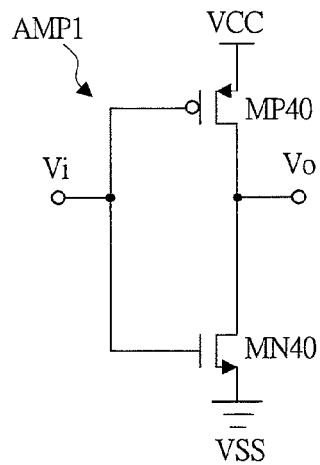
FIGS. 4A to 4F are circuit diagrams each showing a detailed configuration example of an amplifier circuit in the pre-amplifier circuit of FIG. 1.
Figure 4B:
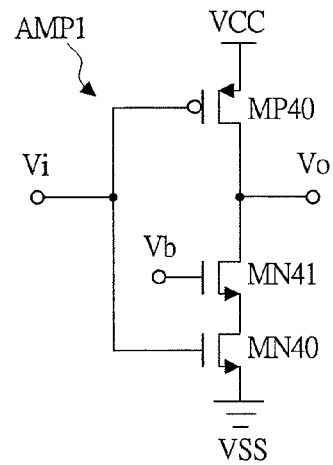

FIGS. 4A to 4F are circuit diagrams each showing a different detailed configuration example of the amplifier circuit AMP1 in the pre-amplifier circuit PREAMP1 of FIG. 1. The amplifier circuit shown in FIG. 4A is configured by the CMOS inverter circuit including a PMOS transistor MP40 and an NMOS transistor MN40 similarly to the case of FIG. 3. The amplifier circuit shown in FIG. 4B is configured by the similar CMOS inverter circuit including the MP40 and the MN40 to that of FIG. 4A in which a grounded-gate type NMOS transistor MN41 with taking a fixed voltage Vb as a gate voltage is further inserted between its output node (Vo) and a drain of the MN40. The MN40 and the MN41 are connected to each other by a so-called cascode connection. In this manner, a Miller capacitance (gate-drain capacitance Cgd) of the MN40 is decreased, and besides, an output impedance at a drain of the MN41 is increased, and therefore, the high frequency characteristic of the amplifier circuit itself can be improved, and the high gain characteristic can be achieved.

Figure 4C:
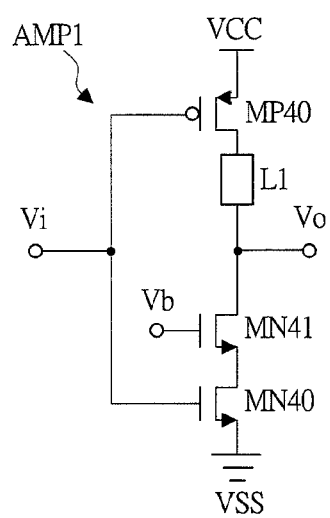

The amplifier circuit shown in FIG. 4C is configured by the similar CMOS inverter circuit with the cascode connection including the MP40, the MN40, and the MN41 to that of FIG. 4B in which an inductor L1 is further inserted between its output node (Vo) and a drain of the MP40. In order to achieve the high gain characteristic of the amplifier circuit, it is required to increase a mutual conductance (transconductance) gm by designing a size of each MOS transistor to be large. However, in this designing, there is a concern of decrease in the bandwidth due to its own parasitic capacitance. More particularly, there arises a problem of the decrease in the bandwidth due to the PMOS transistor MP40 whose driving capacity is lower than that of the NMOS transistor. Accordingly, by providing the L1, the impedance in the high frequency region is increased to improve the gain (that is, peaking), and therefore, the high frequency characteristic can be further improved than the case of FIG. 4B.

Figure 4D:
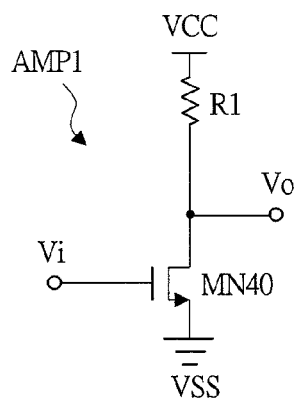
Figure 4E:
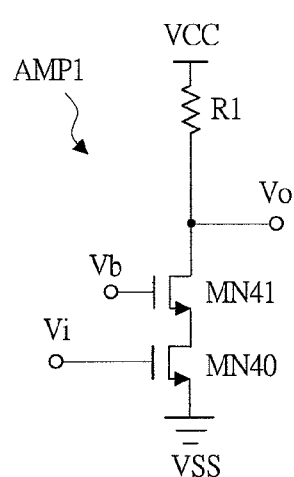
Figure 4F:
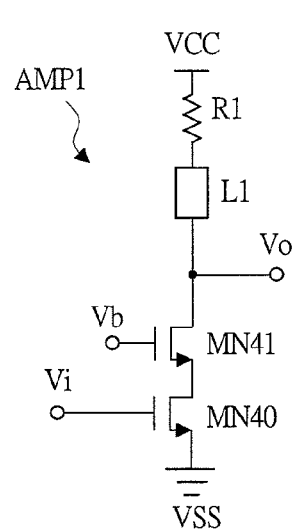

Each amplifier circuit shown in FIGS. 4D to 4F has a configuration in which the PMOS transistor MP40 in each amplifier circuit shown in FIGS. 4A to 4C is replaced by a resistance R1. As described above, since the PMOS transistor has the low driving capacity, the PMOS transistor is replaced by the resistance as shown in FIGS. 4D to 4F, so that the high frequency characteristic can be further improved, and the high gain characteristic can be further achieved.

As described above, each amplifier circuit shown in FIGS. 4A to 4F (more particularly, FIGS. 4B, 4C, 4E, and 4F) has a configuration in which the high gain characteristic is achieved by one stage. Therefore, in order to exhibit the stable amplification characteristic, it is preferred to optimally determine the operating point, and it is effective to use the configuration examples shown in FIGS. 1 and 2. Note that, when each amplifier circuit of FIGS. 4B to 4F is applied to the configuration example of FIG. 2, each of the amplifier circuits AMP1, AMP1$a$, and AMP1$b$ of FIG. 3 may be replaced by the amplifier circuits of FIGS. 4B to 4F similarly to the configuration example of FIG. 3 to which the amplifier circuit of FIG. 4A is applied.

As described above, by using the optical communication device according to the first embodiment, the high-speed operation can be typically achieved. Note that, here, in order to detect the DC components of the input (Vi) and the output (Vo) of the amplifier circuit AMP1 in the pre-amplifier circuit PREAMP1, the operating-point controller circuit VTCTL1 simulating the DC operation of the entire PREAMP1 has been used as shown in FIG. 2. Since the VTCTL1 performs the DC-like operation, the value of the operating point control signal Vcon is also constant, and therefore, the operating point of the AMP1 in the PREAMP1 can be always constant. Here, in some cases, it is considered such that the VTCTL1 is configured by only the amplifier circuit AMP2 and the replica circuit REP of FIG. 2. That is, the (+) input node of the AMP2 is connected to the output node of the level-shift circuit LS1 in the PREAMP1 to control the LS1 by the Vcon from the AMP2. When such a configuration example is used, the operating point cannot be stabilized more than that of the configuration example of FIG. 2, and the reference voltage Vref cannot be generated, either. However, the operating point can be controlled to some extent in a small circuit area.

Second Embodiment

Figure 5:
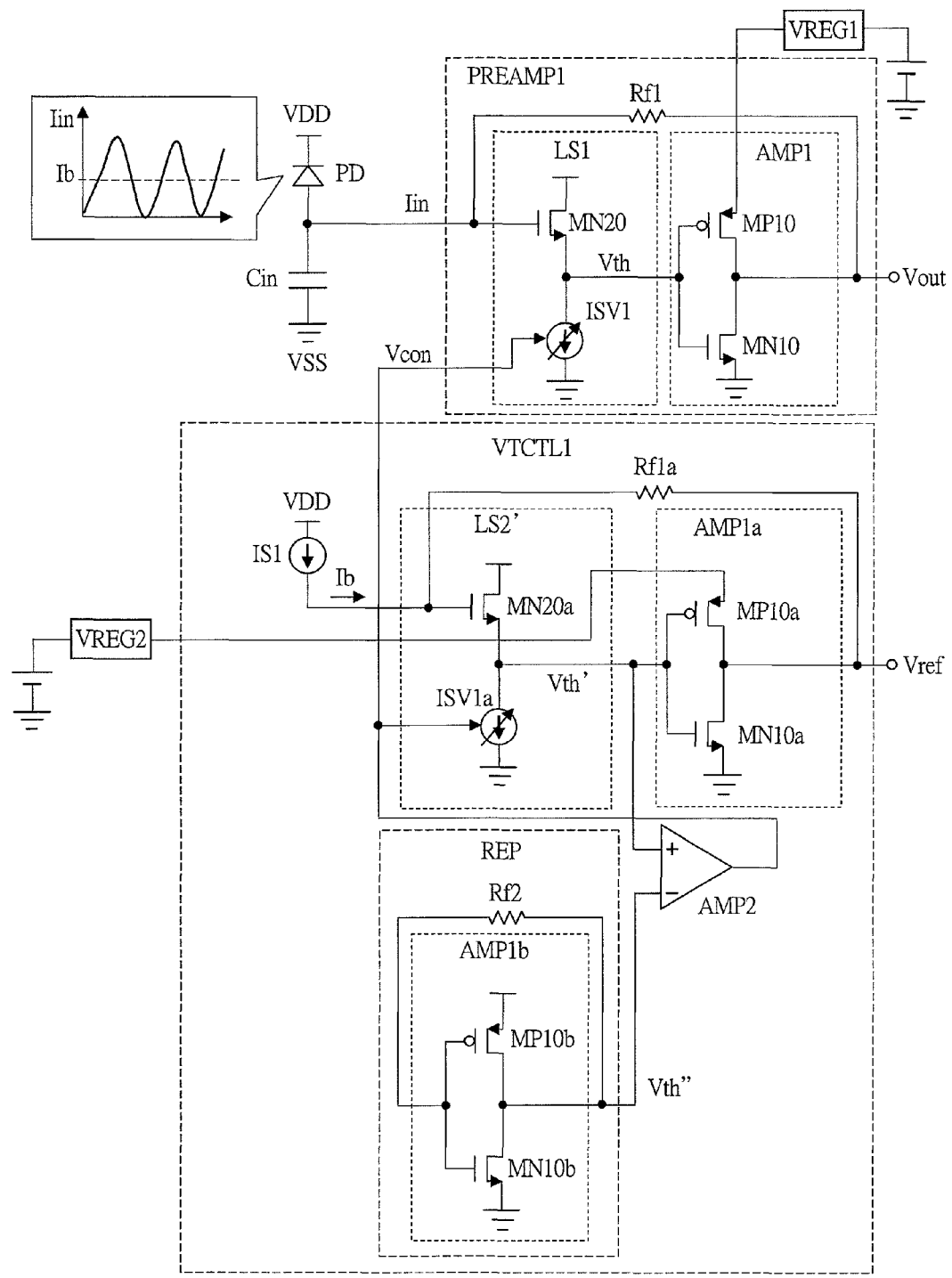
FIG. 5 is a circuit diagram showing a configuration example of a principal unit in an optical communication device according to a second embodiment of the present invention.

In a second embodiment, a modified example of FIG. 3 described above will be described. FIG. 5 is a circuit diagram showing a configuration example of a principal unit in an optical communication device according to the second embodiment of the present invention. In the optical communication device shown in FIG. 5, a circuit configuration in a level-shift circuit LS2' in the operating-point controller circuit VTCTL1 is different from the configuration example of FIG. 3, and besides, a point that regulator circuits VREG1 and VREG2 are added is different therefrom. Other configurations except for them are the same as the configuration example of FIG. 3, and therefore, the detailed description will be omitted.

The LS2' in the VTCTL1 shown in FIG. 5 has a configuration in which a variable current source ISV2 is removed from the LS2 in the VTCTL1 shown in FIG. 3. Also, in FIG. 5, the VREG1 supplies a power supply voltage to the amplifier circuit AMP1 in the pre-amplifier circuit PREAMP1, and the VREG2 supplies a power supply voltage to the amplifier circuit AMP1$a$ in the operating-point controller circuit VTCTL1. In the configuration example of FIG. 3 as describe above, the process variation of each of the amplifier circuits AMP1, AMP1$a$, and AMP1$b$ are corrected by supplying the operating-point correction signal Vc to the ISV2. However, in the configuration example of FIG. 5, the above-described variation can be corrected by finely adjusting the power supply voltages of the AMP1 and the AMP1$a$.

Therefore, similarly to the case of FIG. 3, even if the characteristics of each of the amplifier circuits AMP1, AMP1$a$, and AMP1$b$ are slightly different from the other due to the process variation, their corrections can be made so that these characteristics can be the same. As a result, the high-speed operation of the optical communication device can be achieved.

Third Embodiment

Figure 6A:
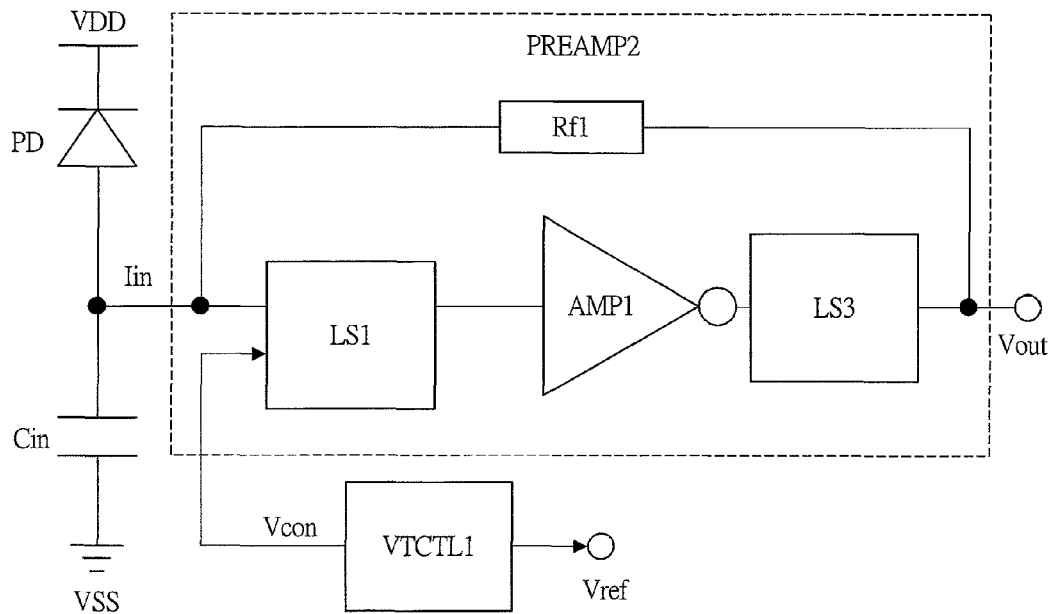
FIGS. 6A and 6B are a block diagram showing a configuration example of a principal unit in an optical communication device according to a third embodiment of the present invention, and a circuit diagram showing a detailed configuration example of a pre-amplifier circuit in FIG. 6A, respectively.
Figure 6B:
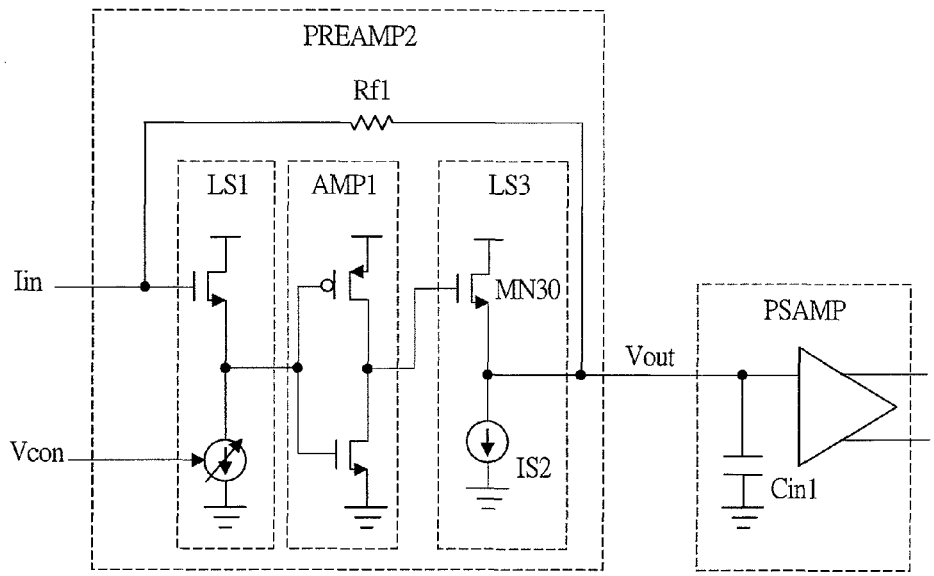

In a third embodiment, a modified example of FIG. 1 described above will be described. FIGS. 6A and 6B show a configuration example of a principal unit in an optical communication device according to the third embodiment of the present invention, FIG. 6A is its block diagram, and FIG. 6B is a circuit diagram showing a detailed configuration example of a pre-amplifier circuit in FIG. 6A. The optical communication device shown in FIG. 6A includes a pre-amplifier circuit PREAMP2 instead of the pre-amplifier circuit PREAMP1 of FIG. 1. The PREAMP2 is different from the PREAMP1 in points that a level-shift circuit LS3 is connected to the output of the amplifier circuit AMP1, and the output of this LS3 is the output node Vout, and besides, is fed back to the level-shift circuit LS1 via the feedback resistance Rf1. Other configurations except for them are the same as those of FIG. 1, and therefore, the detailed description will be omitted.

As shown in FIG. 6B, the PREAMP2 includes: the level-shift circuit LS1; the amplifier circuit AMP1 connected to a latter stage of the LS1; the level-shift circuit LS3 connected to a latter stage of the AMP1; and the feedback resistance Rf1 which feeds back the output of the LS3 to the LS1. Similarly to the case of FIG. 3, each of the LS1 and the AMP1 is configured by a source follower circuit and a CMOS inverter circuit. The LS3 is configured by a source follower circuit including an NMOS transistor MN30 with taking the output of this CMOS inverter circuit as its gate input and a constant current source IS2 connected to a source of the MN30.

In the CMOS inverter circuit of the AMP1, its transistor size is formed to be large in order to achieve the high gain characteristic. Therefore, as shown in FIG. 6B, in order to drive a post-amplifier circuit PSAMP connected to the latter stage of the PREAMP2 at high speed, it is desired to separate a load of the CMOS inverter circuit of the AMP1 from an input capacitance Cin1 of the PSAMP. Further, in order to operate the PSAMP at high speed, it is also desired to appropriately adjust an operating point of the PSAMP. Accordingly, by providing the level-shift circuit LS3 including the source follower circuit, the load of the AMP1 can be separated from the Cin1 of the PSAMP, and besides, the operating point of the PSAMP can be also appropriately adjusted.

As described above, by using the optical communication device according to the third embodiment, the high-speed operation can be typically achieved. Note that, here, the example that the CMOS inverter circuit is used as the amplifier circuit AMP1 has been described. However, instead of that, the circuit as shown in FIGS. 4B to 4F can be obviously used.

Fourth Embodiment

Figure 7:
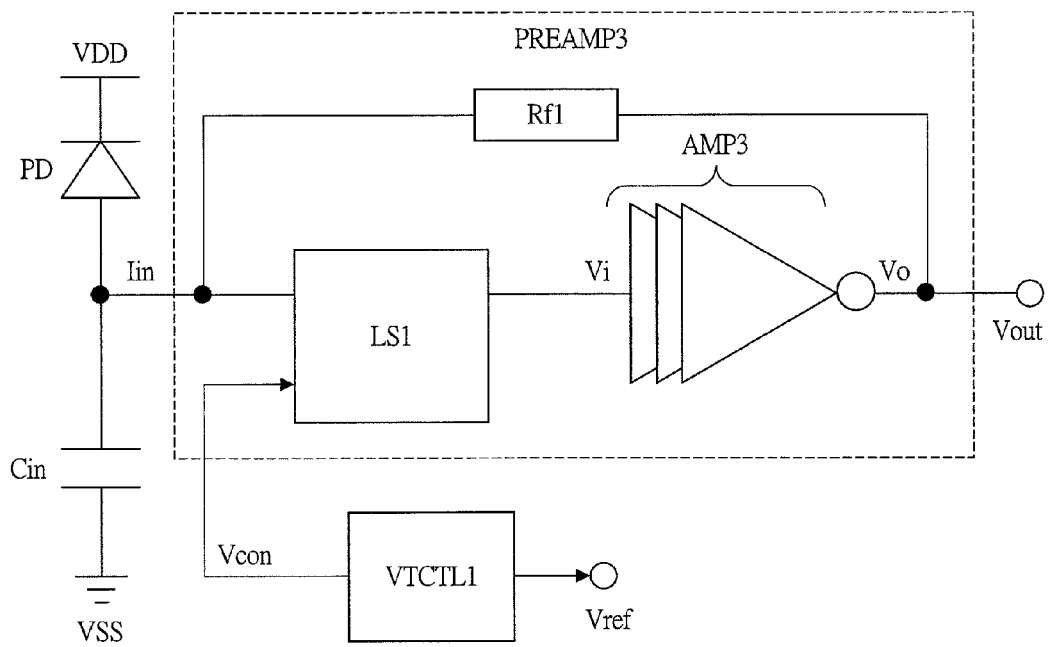
FIG. 7 is a block diagram showing a configuration example of a principal unit in an optical communication device according to a fourth embodiment of the present invention.

In a fourth embodiment, another modified example of FIG. 1 described above will be described. FIG. 7 is a block diagram showing a configuration example of a principal unit in an optical communication device according to the fourth embodiment of the present invention. The optical communication device shown in FIG. 7 includes a pre-amplifier circuit PREAMP3 instead of the pre-amplifier circuit PREAMP1 of FIG. 1. The PREAMP3 is different from the PREAMP1 in a point that an amplifier circuit AMP3 having a plurality of stages is provided instead of the amplifier circuit AMP1 having one stage in the PREAMP1. Other configurations except for that are the same as those of FIG. 1, and therefore, the detailed description will be omitted. The AMP3 is configured to totally have a negative gain so that the PREAMP3 has a negative feedback configuration.

As described above, it is desired to configure the amplifier circuit in the pre-amplifier circuit by a smaller number of stages (desirably, one stage) in order to achieve the low noise characteristic. However, practically, it may be difficult to achieve the high gain characteristic and the high speed performance by the one-stage configuration due to the influence of the parasitic capacitance in the amplifier circuit or others in some cases, and the high gain characteristic and the high speed performance may be required in some cases even if the noise characteristic is slightly sacrificed. In such a case, a configuration example as shown in FIG. 7 is useful.

Figure 8:
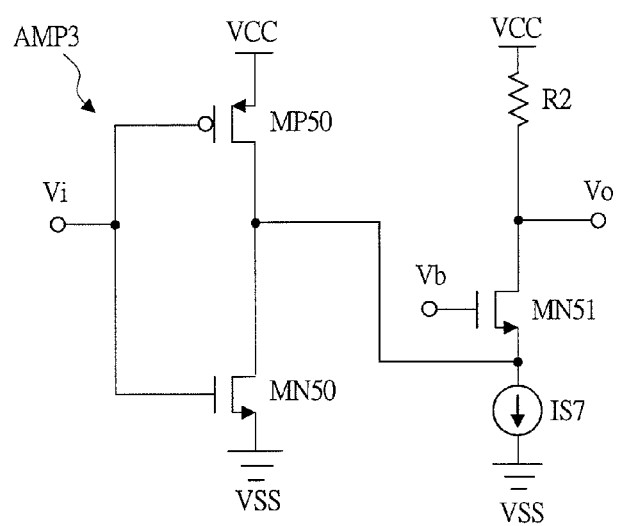
FIG. 8 is a circuit diagram showing a detailed configuration example of an amplifier circuit in the pre-amplifier circuit of FIG. 7.

FIG. 8 is a circuit diagram showing a detailed configuration example of the amplifier circuit AMP3 in the pre-amplifier circuit PREAMP3 of FIG. 7. The amplifier circuit AMP3 shown in FIG. 8 is configured by: a CMOS inverter circuit including a PMOS transistor MP50 and an NMOS transistor MN50; and a grounded-gate amplifier stage connected to a latter stage of the CMOS inverter circuit and including an NMOS transistor MN51, a constant current source IS7, and a resistance R2. In the MN51, a fixed voltage Vb is applied to its gate, and a source is connected to the IS7, and besides, is connected to an output of the CMOS inverter circuit at the former stage in parallel to the IS7. A drain of the MN51 is connected to the resistance R2, and besides, outputs the output voltage signal Vo.

In using such a configuration, an amplifier circuit with a high gain can be achieved by the CMOS inverter circuit in the former stage and the grounded-gate amplifier stage in the latter stage. As described above, since the operating point of the input of the CMOS inverter circuit is optimally determined by the operating-point controller circuit VTCTL1 of FIG. 7 (FIG. 2), the CMOS inverter circuit in the former stage performs a stable operation with a desired gain. In this CMOS inverter circuit, since the grounded-gate amplifier stage is provided in the latter stage, it may be designed to put a priority on the high speed performance to decrease the parasitic component. Note that, in the VTCTL1 in case of using the configuration example of FIG. 8, each of the amplifier circuits AMP1, AMP1a, and AMP1b in the configuration example of FIG. 3 may be replaced by each amplifier circuit of FIG. 8.

As described above, by using the optical communication device according to the fourth embodiment, the high-speed operation can be typically achieved. Note that, here, the amplifier circuit AMP3 is configured by the CMOS inverter circuit and the grounded-gate amplifier stage. However, the configuration is not limited to this, and various configurations can be applied as long as the negative gain is obtained. For example, a configuration obtained by combining each amplifier circuit shown in FIG. 4 with the grounded-gate amplifier stage can be used. Alternately, in some cases, a configuration by a CMOS inverter circuit having three stages is also possible.

Fifth Embodiment

Figure 9A:
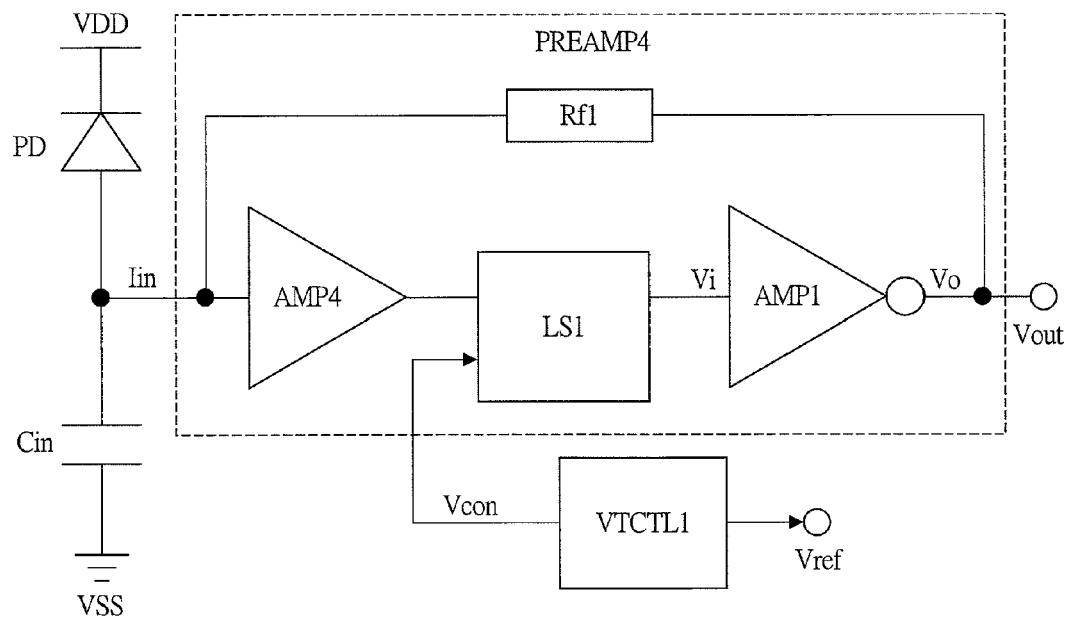
FIGS. 9A and 9B are a block diagram showing a configuration example of a principal unit in an optical communication device according to a fifth embodiment of the present invention, and a circuit diagram showing a detailed configuration example of a pre-amplifier circuit in FIG. 9A, respectively.
Figure 9B:
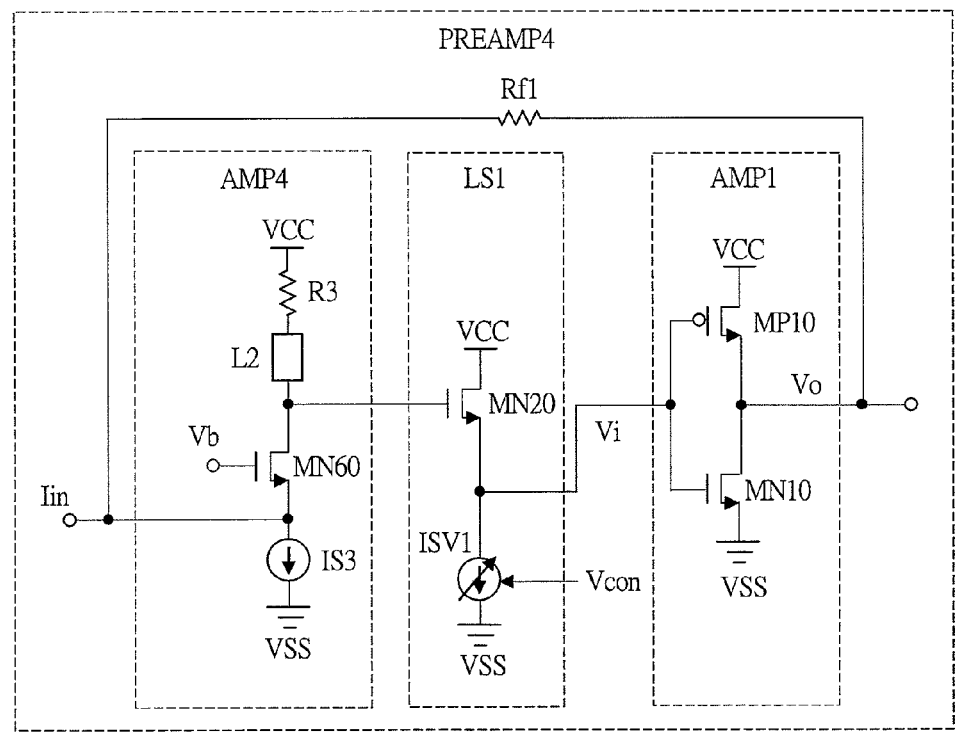

In a fifth embodiment, still another modified example of FIG. 1 described above will be described. FIG. 9A is a block diagram showing a configuration example of a principal unit in an optical communication device according to the fifth embodiment of the present invention, and FIG. 9B is a circuit diagram showing a detailed configuration example of the pre-amplifier circuit PREAMP4 in FIG. 9A. The optical communication device shown in FIG. 9A includes a pre-amplifier circuit PREAMP4 instead of the pre-amplifier circuit PREAMP1 of FIG. 1. The PREAMP4 is different from the PREAMP1 in points that an amplifier circuit AMP4 is provided in a former stage of the level-shift circuit LS1 in the PREAMP1, and that the AMP4 receives a current signal Iin from the photodiode PD and a feedback signal from the feedback resistance Rf1. Other configurations except for them are the same as those of FIG. 1, and therefore, the detailed description will be omitted. The AMP4 is configured to totally have a positive gain.

As shown in FIG. 9B, the AMP4 is a grounded-gate amplifier stage including an NMOS transistor MN60, a constant current source IS3, an inductor L2, and a resistance R3. In the MN 60, a fixed voltage Vb is applied to its gate, and its source is connected in parallel to one end of the Rf1 and the IS3, and besides, receives the current signal Iin from the PD. The R3 and the L2 are connected in series between a power supply voltage VCC and a drain of the MN60. This L2 functions for peaking as described in FIG. 4.

The level-shift circuit LS1 provided in the latter stage of the AMP4 is a source follower circuit including the NMOS transistor MN20 and the variable current source ISV1 connected to a source of the MN20. A gate of the MN20 receives an output signal from the drain of the MN60. A current value of the ISV1 is controlled by the operating-point control signal Vcon described above. The AMP1 provided in the latter stage of the LS1 is configured by a CMOS inverter circuit including the PMOS transistor MP10 and the NMOS transistor MN10. This CMOS inverter circuit performs the amplifying operation with taking an output signal from a source of the MN20 as the input voltage signal Vi, and outputs the output voltage signal Vo. An output from this CMOS inverter circuit is fed back to an input of the AMP4 via the Rf1.

Since the AMP4 including the grounded-gate amplifier stage receives the current signal Iin from the PD, by using such a configuration, its input impedance can be decreased, and the high frequency characteristic can be improved. Also, as described above, its output signal is level-shifted so that the optimum operating point is obtained at the AMP1 (the CMOS inverter circuit) by the LS1. Therefore, the AMP1 performs a stable operation with a desired gain. At this time, in the AMP1, since the grounded-gate amplifier stage is provided in the former stage, it may be designed to put a priority on the high speed performance to decrease the parasitic component. Note that the VTCTL1 in the case of using the configuration example of FIG. 9B may have a configuration in which the AMP4 is inserted between the former stage of the LS1 in the PREAMP1 and the former stage of the LS2 in the VTCTL1 in the configuration example of FIG. 3.

As described above, by using the optical communication device according to the fifth embodiment, the high-speed operation can be typically achieved. Note that, here, the example that the CMOS inverter circuit is used as the amplifier circuit AMP1 is described. However, instead of that, each circuit as shown in FIGS. 4B to 4F can be obviously used.

Sixth Embodiment

Figure 10:
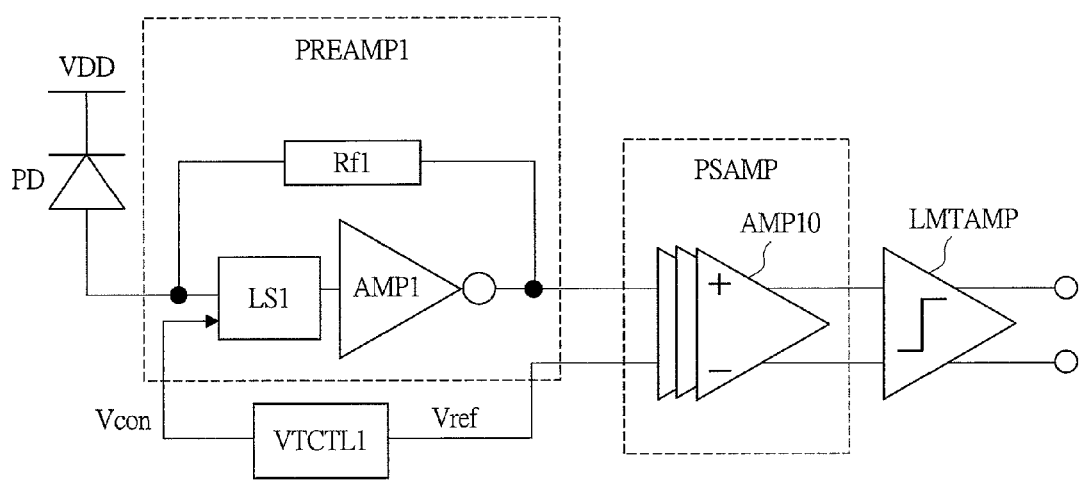
FIG. 10 is a block diagram showing a configuration example of an optical communication device according to a sixth embodiment of the present invention.

In a sixth embodiment, an entire configuration example in a case that an optical communication device is structured by using the configuration example of FIG. 1 will be described. FIG. 10 is a block diagram showing a configuration example of the optical communication device according to the sixth embodiment of the present invention. The optical communication device shown in FIG. 10 includes, in addition to the photodiode PD, the pre-amplifier circuit PREAMP1, and the operating-point controller circuit VTCTL1 shown in FIG. 1: the post-amplifier circuit PSAMP; and a limit amplifier circuit LMTAMP, which are provided in a latter stage of the pre-amplifier circuit PREAMP1. As compared with the optical communication device of FIG. 16, the optical communication device of FIG. 10 has a configuration in which the pre-amplifier circuit PREAMP_C is replaced by the PREAMP1, the VTCTL1 is added, and besides, the voltage-reference generator circuit VREFG is removed.

Figure 16:
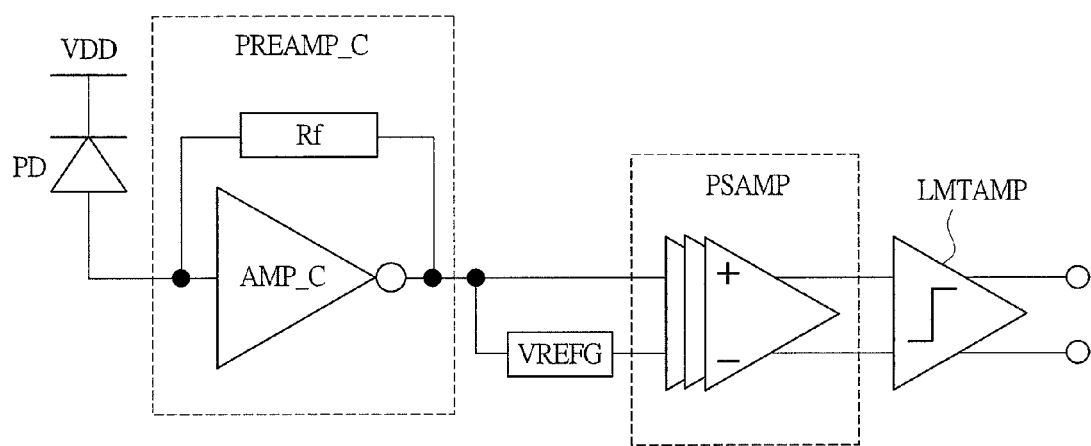
FIG. 16 is a schematic diagram showing a configuration example of an optical communication device studied as an assumption of the present invention.
Figure 17A:
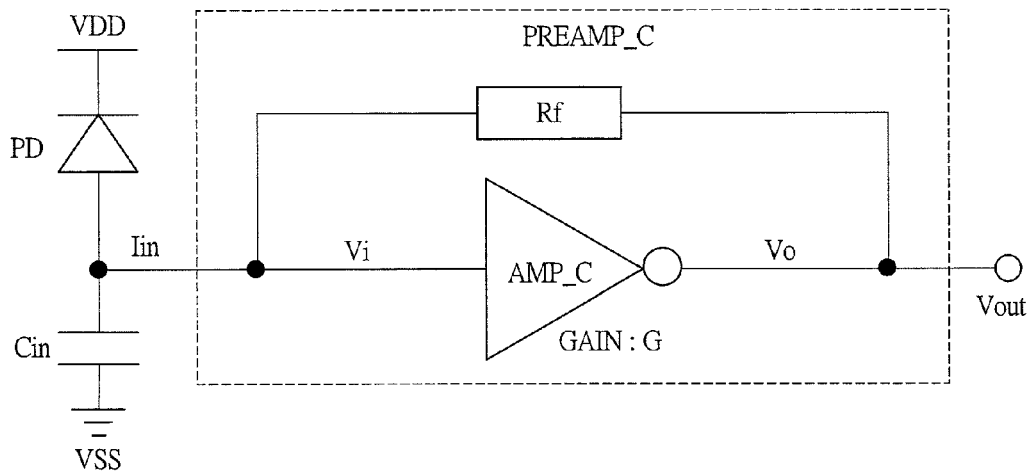
FIGS. 17A to 17C are explanatory diagrams each showing a detail of a pre-amplifier circuit in FIG. 16.
Figure 17B:
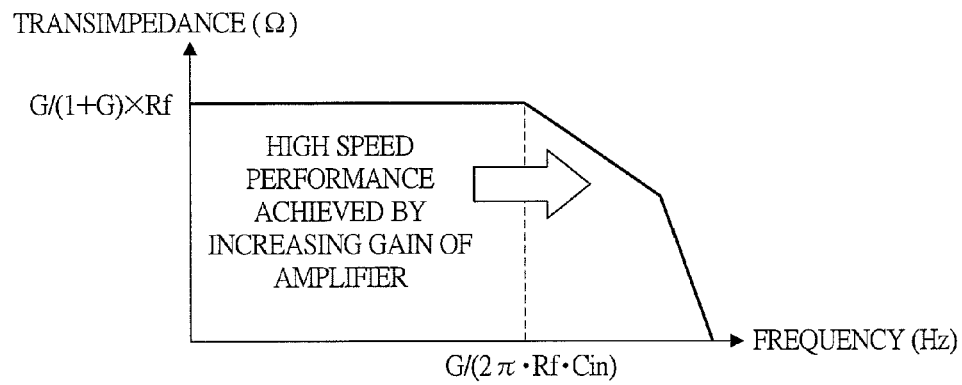
Figure 17C:
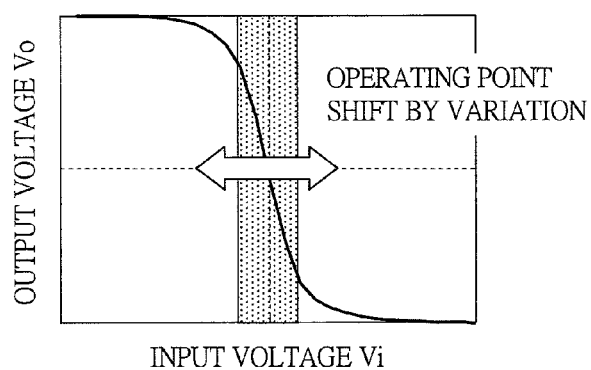

As described in FIG. 16, since the PSAMP has the differential input/output configuration, the VREFG is a circuit for detecting the DC component of the output of the PREAMP_C by the low pass filter. However, in the configuration example of FIG. 10, as shown in FIG. 2 and others, the VTCTL1 has a configuration in which the VTCTL1 can generate the DC component of the output of the PREAMP1 as the reference voltage Vref, and therefore, the VREFG is unnecessary by using this Vref. Therefore, the VREFG which normally occupies a large area can be removed, and therefore, a circuit area can be decreased. Further, by generating the Vref by the VTCTL1 which performs the DC-like operation, a more stable reference voltage can be generated than that in the case of using the low pass filter, and, as a result, the high speed amplifying operation can be contributed by the PSAMP.

Figure 11A:
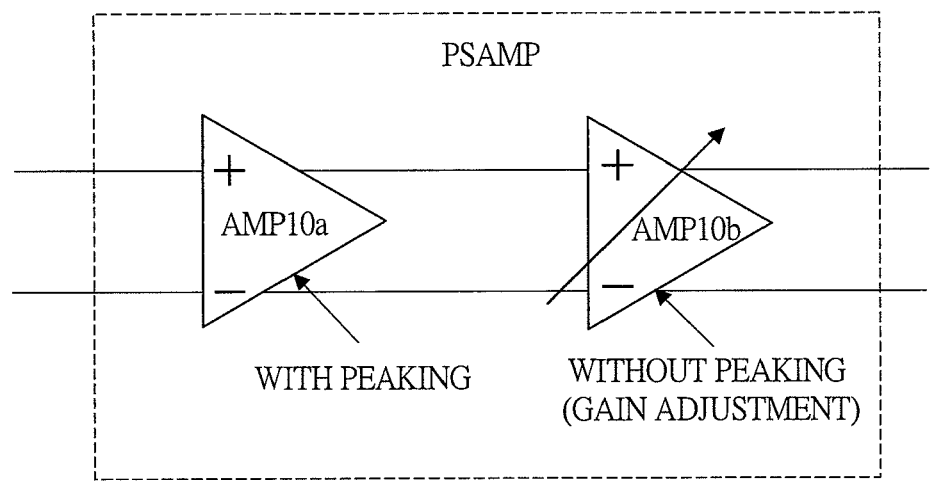
FIGS. 11A and 11B are a schematic diagram showing a configuration example of a post-amplifier circuit in the optical communication device of FIG. 10, and an explanatory diagram showing an operation example of FIG. 11A, respectively.
Figure 11B:
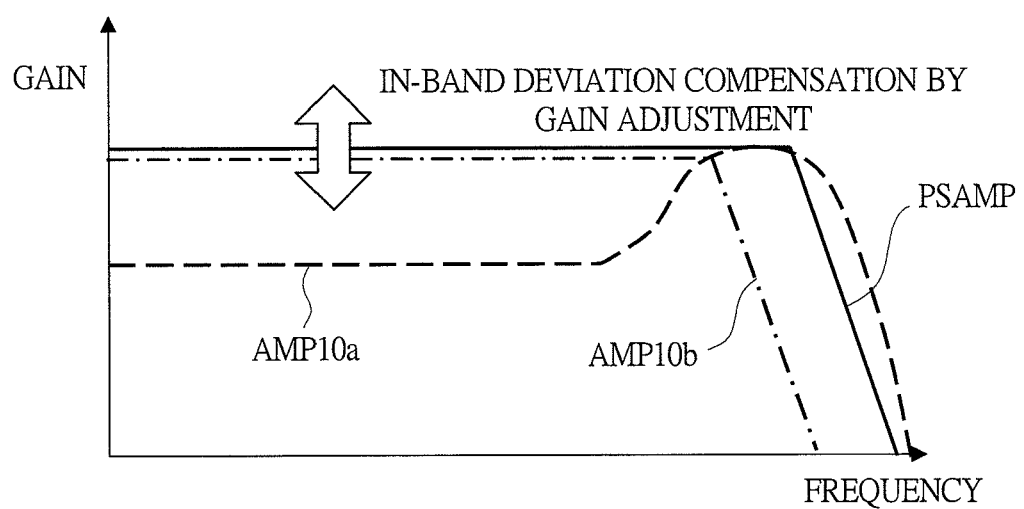

FIGS. 11A and 11B show one example of the post-amplifier circuit PSAMP in the optical communication device of FIG. 10, FIG. 11A is a schematic diagram showing a configuration example of the PSAMP, and FIG. 11B is an explanatory diagram showing an operation example of FIG. 11A. The post-amplifier circuit PSAMP shown in FIG. 11A is configured by amplifier circuits AMP10a and AMP10b which have a differential configuration therebetween. The AMP10a has a configuration in which the peaking can be performed by using, for example, a similar inductor element to that of FIG. 4F or others as the load element in a normal differential amplifying circuit including two transistors functioning as a differential pair and a load element connected to each transistor. As shown in FIG. 10, the reference voltage Vref from the operating-point controller circuit VTCTL1 is inputted to one of the two transistors functioning as the differential pair. Also, the AMP10b connected to a latter stage of the AMP10a does not include any particular peaking function, and is a normal differential amplifying circuit.

By using such a configuration, as shown in FIG. 11B, in the AMP10a in the former stage, while a gain in low and middle frequency bands is decreased, a gain in a high frequency band is increased by the peaking function. On the other hand, in the AMP10b in the latter stage, while the gain in the low and middle frequency bands is increased, the gain in the high frequency band is decreased by the parasitic component. Therefore, by combining these amplifier circuits AMP10a and AMP10b, the gain and the frequency bandwidth can be totally secured to some extent.

As described above, by using the optical communication device according to the sixth embodiment, the high-speed operation can be typically achieved. Note that, here, the configuration example of FIG. 1 is used as the amplifier circuit. However, each configuration example as shown in FIGS. 6A and 6B, 7, 9A and 9B, and others can be obviously used.

Seventh Embodiment

Figure 12A:
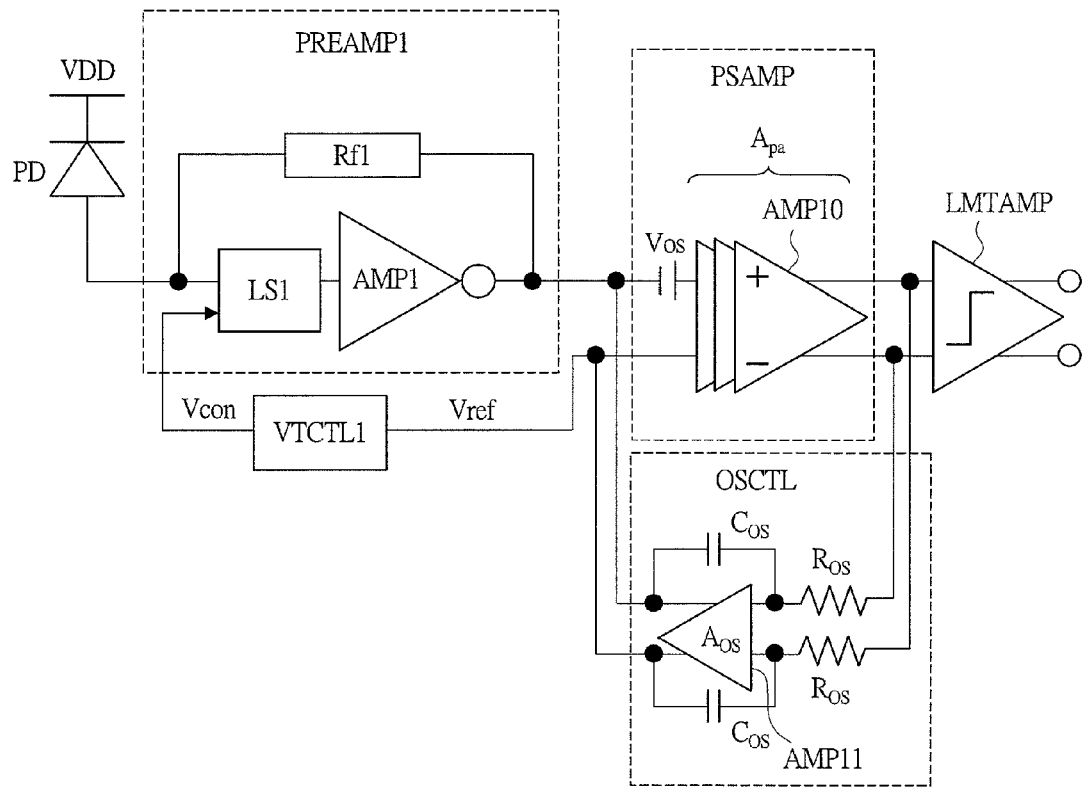
FIGS. 12A and 12B are a block diagram showing a configuration example of an optical communication device according to a seventh embodiment of the present invention, and an explanatory diagram showing an effect example of FIG. 12A, respectively.
Figure 12B:
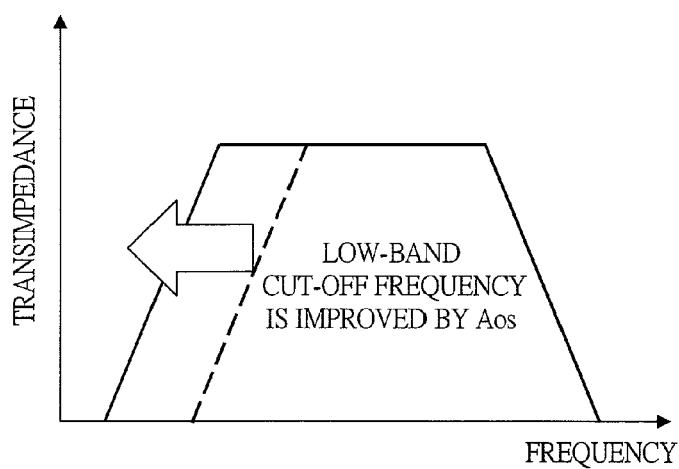
Figure 15:
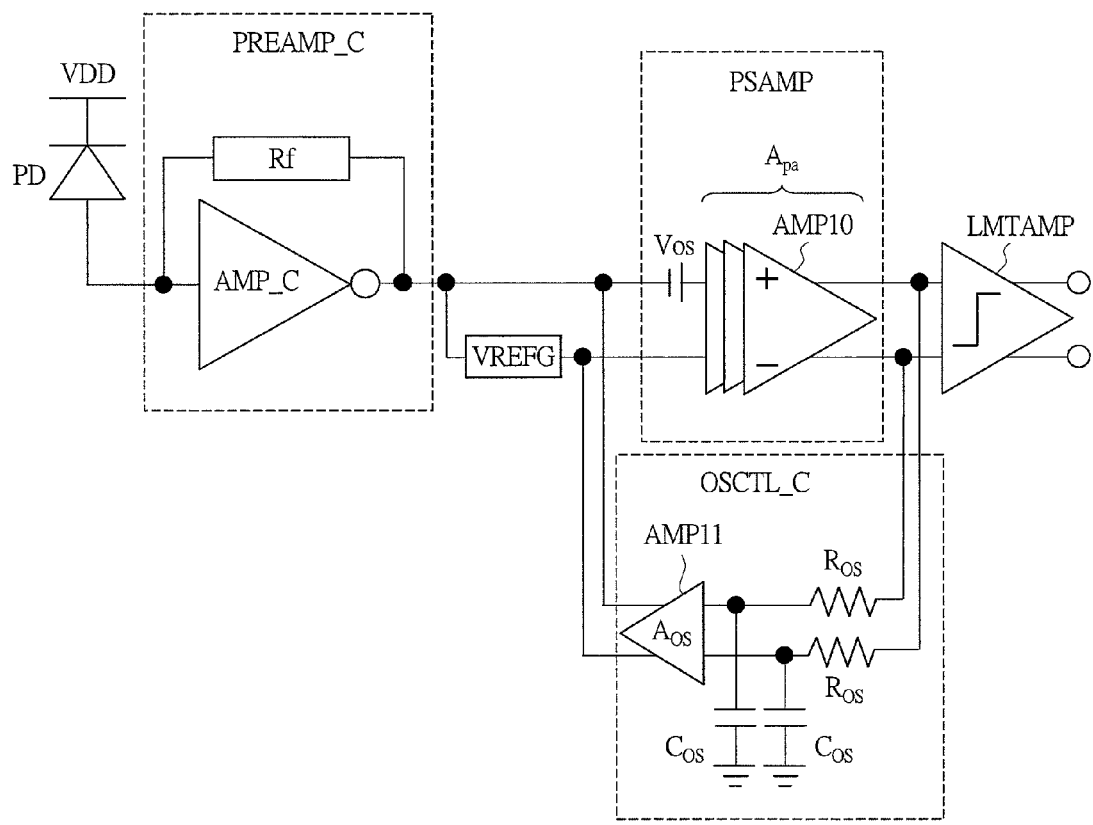
FIG. 15 is a block diagram showing a configuration example of an optical communication device studied as a comparison object of FIG. 12.

In a seventh embodiment, a configuration example by which a performance of the post-amplifier circuit PSAMP is further improved in the optical communication device of FIG. 10 described above will be described. FIGS. 12A and 12B show an optical communication device according to the seventh embodiment of the present invention, FIG. 12A is a block diagram showing its configuration example, and FIG. 12B is an explanatory diagram showing an effect example of FIG. 12A. FIG. 15 is a block diagram showing a configuration example of the optical communication device studied as a comparison object of FIG. 12.

First, the optical communication device shown in FIG. 15 has a configuration in which an offset correction circuit OSCTL_C is added between the input and the output of the post-amplifier circuit PSAMP in the optical communication device of FIG. 16 described above. The PSAMP includes a differential amplifying circuit having a plurality of stages which includes an amplifier circuit AMP10 with a total gain as Apa. The AMP10 normally contains an offset voltage Vos to be a noise component due to the process variation or others. The OSCTL_C is provided in order to decrease this Vos. The OSCTL_C includes: a low pass filter for detecting a DC component of each of the (+) output and the (−) output from the AMP10; and an amplifier circuit AMP11 which differentially amplifies between the (+) output and the (−) output via this low pass filter by the gain Aos. The (+) output and the (−) output of this AMP11 are negatively fed back to the (−) input and the (+) input of the AMP10. The low pass filter is configured by: a resistance Ros connected in series between an output of the AMP10 and tan input of the AMP11; and a capacitance Cos connected between the input of the AMP11 and a ground voltage VSS.

As described in FIG. 16, an output voltage magnitude from the pre-amplifier circuit PREAMP_C is, for example, about 10 mV which is small. For example, when the offset voltage Vos which is nearly equal to the magnitude is generated in the post-amplifier circuit PSAMP, a desired operation cannot be obtained, and therefore, it is important to compensate the offset voltage. Accordingly, by using the configuration example as shown in FIG. 15, the offset voltage Vos to be the DC component is compressed as much as about $1/(Apa \cdot Aos)$ in the output of the AMP10, and can be decreased to, for example, about 100 µV or lower. On the other hand, for the input/output signals of the AMP10 to be an AC component, the negative feedback operation can hardly function due to the cutting off by the low pass filter in the OSCTL_C, and therefore, the output signal of the AMP10 is obtained by amplifying the input signal by about the Apa. Also, a low-band cut-off frequency of the output signal of the AMP10 is almost expressed as "$Apa \cdot Aos/(2\pi \cdot Ros \cdot Cos)$".

However, in this case, there is a concern of a waveform distortion or others for the output signal of the AMP10 due to extremely high low-band cut-off frequency. It is desired to configure the PSAMP so as to be the low offset and also amplify a low-band signal of, for example, about 100 kHz. That is, ideally, it is desired to configure the PSAMP so that the low pass filter in the OSCTL_C passes only the DC component. In order to achieve this, it is considered such that the Cos or others is formed large. However, by this formation, a circuit area is increased, and there is a concern that it is realistically difficult to form the PSAMP in a semiconductor chip.

Accordingly, the configuration example of FIG. 12 is useful. The optical communication device shown in FIGS. 12A and 12B is a configuration example in which an offset correction circuit OSCTL is added between an input and an output of the post-amplifier circuit PSAMP in the configuration example of FIG. 10 described above. The OSCTL in FIGS. 12A and 12B is different from the OSCTL_C of FIG. 15 so that the capacitance Cos is provided between an input and an output of the amplifier circuit AMP11. In this manner, the Cos functions as the Miller capacitance, and therefore, the low-band cut-off frequency in the output signal of the AMP10 in the PSAMP is almost expressed as "$Apa/(2\pi \cdot Ros \cdot Cos)$". Therefore, as shown in FIG. 12B, since the low-band cut-off frequency is decreased by the gain Aos of the AMP11, the problems as described above can be solved.

Thus, by employing the optical communication device according to the seventh embodiment, it is possible to typically decrease the offset voltage and also enhance the frequency bandwidth in the post-amplifier circuit.

Eighth Embodiment

Figure 13:
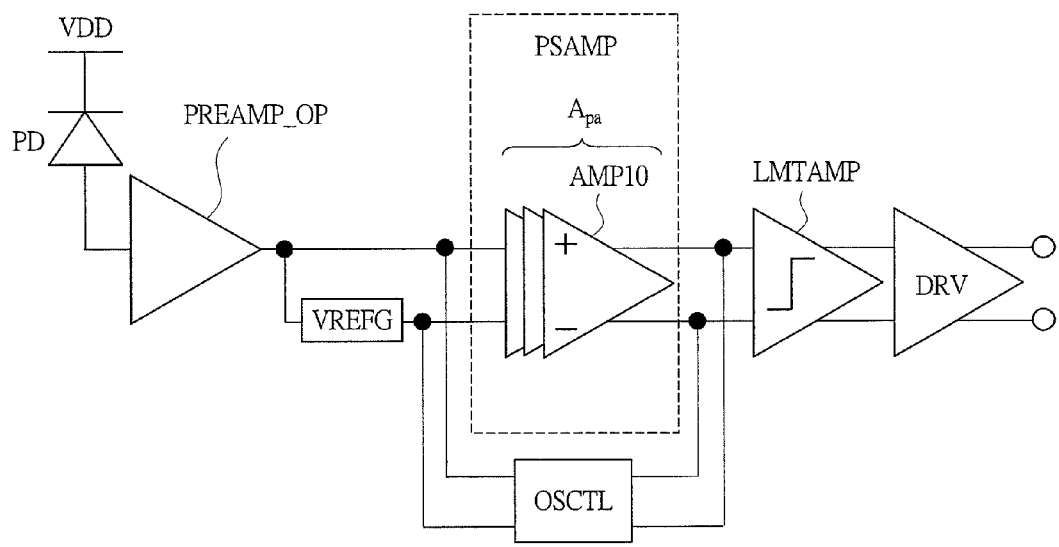
FIG. 13 is a block diagram showing a configuration example of an optical communication device according to an eighth embodiment of the present invention.

In an eighth embodiment, an example in a case of using a pre-amplifier circuit having an open-loop configuration instead of the pre-amplifier circuit having the negative feedback configuration as the pre-amplifier circuit will be described. FIG. 13 is a block diagram showing a configuration example of an optical communication device according to the eighth embodiment of the present invention. The optical communication device shown in FIG. 13 is configured by: a pre-amplifier circuit PREAMP_OP having an open-loop configuration with taking a current signal from the photodiode PD as its input; the post-amplifier circuit PSAMP; the limit amplifier circuit LMTAMP; and the output driver circuit DRV, the post-amplifier circuit, the limit amplifier circuit, and the output driver circuit being sequentially connected to a latter stage of the pre-amplifier circuit; the voltage-reference generator circuit VREFG; the offset correction circuit OSCTL; and others.

The configurations and operations of the VREFG, the PSAMP, and the LMTAMP are the same as those described in FIG. 16. Also, the configuration and operation of the OSCTL are also the same as those described in FIG. 12. The DRV is installed to drive an external load. If the pre-amplifier circuit is formed as an independent chip, it is desired to provide the DRV in this manner to drive the external load. However, if the DRV is formed on the same chip as including the circuits in the latter stage of the pre-amplifier circuit, the DRV may not be particularly provided.

Figure 14A:
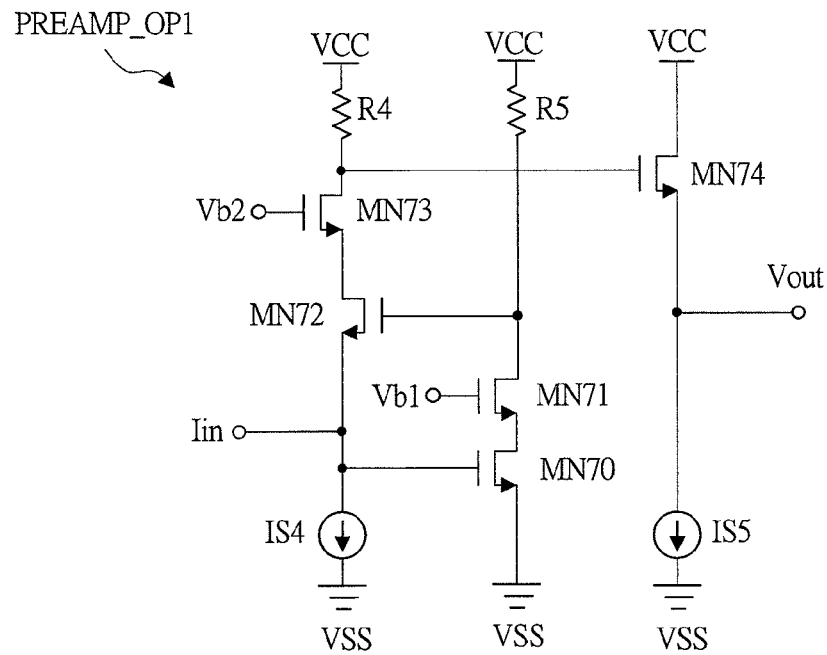
FIGS. 14A and 14B are circuit diagrams each showing a detailed configuration example of a pre-amplifier circuit in the optical communication device of FIG. 13.
Figure 14B:
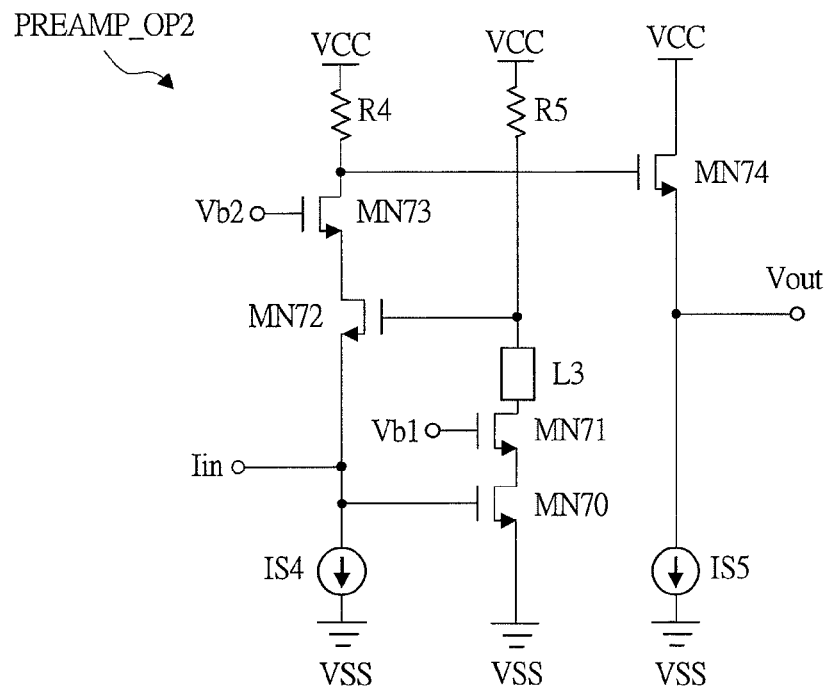

Each of FIGS. 14A and 14B is a circuit diagram showing a detailed configuration example of the pre-amplifier circuit PREAMP_OP in the optical communication device of FIG. 13. A pre-amplifier circuit PREAMP_OP1 shown in FIG. 14A is configured by: NMOS transistors MN70 to MN74; resistances R4 and R5; and constant current sources IS4 and IS5. The MN70, the MN71, and the R5 configure a grounded-source amplifier stage having a cascode connection, the MN72, the MN73, the R4, and the IS4 configure a grounded-gate amplifier stage having a cascode connection, and the MN74 and the IS5 configure a source follower stage.

In the MN70, its source is connected to the ground voltage VSS, its gate is connected to the input node of the current signal Iin from the PD, and its drain is connected to a source of the MN71. In the MN71, a fixed voltage Vb1 is applied to its gate, and its drain is connected to one end of the R5 and a gate of the MN72. In the MN72, its source is connected to the input node of the Iin, and its drain connected to a source of the MN73. The IS4 is connected between the input node of the Iin and the VSS. In the MN73, a fixed voltage Vb2 is applied to its gate, and its drain is connected to one end of the R4 and a gate of the MN74. In the MN74, its source is connected to the output node Vout, and its drain is connected to the power supply voltage VCC. The IS5 is connected between the Vout and the VSS. Also, the other ends of the R4 and the R5 are connected to the VCC.

In the configuration example of FIG. 14A, the Iin is amplified and converted into a voltage signal at the grounded-gate amplifier stage, and then, is outputted from the Vout via the source follower stage as the voltage signal. In the amplification at this grounded-gate amplifier stage, the MN72 is gain-boosted by the output from the grounded-source amplifier stage, and therefore, the amplification with a high gain can be achieved. On the other hand, in the pre-amplifier circuit having such an open-loop configuration, since no effect of decreasing the input impedance by the negative feedback configuration as shown in FIG. 1 or others can be obtained, it is desired to decrease the input impedance as small as possible by forming each transistor size of the MN70 and the MN72 to be large.

However, in this case, parasitic capacitances of the MN70 and the MN72 are increased, and there is a concern that the high speed performance is prevented by decreasing poles due to the increase of the parasitic capacitances. Accordingly, it is useful to provide the MN71 and the MN73 which configure each cascode connection between the MN70 and the MN72. Each of the MN71 and the MN73 is formed so as to have a small transistor size to decrease the Miller effect of the gate-drain capacitance Cgd of the MN70 and MN72. Therefore, the increase of the input capacitance in each amplifier stage is suppressed, and therefore, the high speed performance of the pre-amplifier circuit can be achieved.

Also, a pre-amplifier circuit PREAMP_OP2 shown in FIG. 14B is different from the PREAMP_OP1 of FIG. 14A in a point that an inductor L3 is inserted between the drain of the MN71 and the gate of the MN72. Other configurations except for that are the same as those of FIG. 14A. In the circuit configuration of FIG. 14A, the high speed performance can be achieved by achieving the high gain characteristic by the negative feedback loop of the MN70 to MN72 to decrease the input impedance. As shown in FIG. 14B, by inserting the inductor L3 into this loop, the higher gain characteristic can be achieved, and the high speed performance can be achieved.

As described above, by using the optical communication device according to the eighth embodiment, typically, the parasitic component in the circuits is decreased smaller than that of the configuration as described in Non-Patent Document 2, and the high speed operation can be achieved by the small parasitic component.

In the foregoing, the invention made by the inventors has been concretely described based on the embodiments. However, it is needless to say that the present invention is not limited to the foregoing embodiments and various modifications and alterations can be made within the scope of the present invention.

INDUSTRIAL APPLICABILITY

Each optical communication device according to the present embodiments is particularly effectively applied to a circuit of a receiving unit in an optical communication system having a communication speed exceeding several tens of Gbps.

The invention claimed is:

1. An optical communication device comprising:
a pre-amplifier circuit including an input node to which a current signal from a photodiode is inputted and an output node, and amplifying a current signal from the input node, converting an amplified signal into a voltage signal, and outputting a converted signal to the output node; and
a first controller circuit controlling the pre-amplifier circuit,
the pre-amplifier circuit including:
a first level-shift circuit provided on a first path between the input node and the output node, and level-shifting a voltage level of a signal inputted via the input node by an amount in accordance with a first control signal;
a first amplifier circuit connected to a subsequent stage of the first level-shift circuit on the first path, and amplifying an output signal of the first level-shift circuit with a negative gain and outputting an amplified signal to the output node; and
a feedback resistance provided on a second path connected in parallel to the first path between the input node and the output node,
the first controller circuit including a replica circuit having a replica of the first amplifier circuit with an input and an output thereof being electrically connected to each other, the first controller circuit generating the first control signal so that a direct current level of an output signal of the replica circuit is matched with a direct current level of an input signal of the first amplifier circuit.

2. The optical communication device according to claim 1, wherein
the first controller circuit includes:
a first current source generating the same direct current as a direct current level of a current signal from the photodiode;
a replica pre-amplifier circuit configured as a replica of the pre-amplifier circuit, and performing an amplifying operation with taking the direct current from the first current source as its input; and
a second amplifier circuit performing an amplifying operation with taking an input signal of the first amplifier circuit in the replica pre-amplifier circuit and an output signal of the replica circuit as its differential input, and outputting the first control signal, and
the first level-shift circuit in the pre-amplifier circuit and the first level-shift circuit in the replica pre-amplifier circuit are operated by receiving the first control signal.

3. The optical communication device according to claim 2, wherein
a second control signal in addition to the first control signal is further inputted to the first level-shift circuit in the replica pre-amplifier circuit, and a level shift amount can be finely adjusted by an amount in accordance with the second control signal.

4. The optical communication device according to claim 1, wherein
the first level-shift circuit is a source follower circuit including a first variable current source whose current value is adjusted in accordance with the first control signal, and
the first amplifier circuit is a CMOS inverter circuit.

5. The optical communication device according to claim 1, wherein
the first level-shift circuit is a source follower circuit including a first variable current source whose current value is adjusted in accordance with the first control signal, and
the first amplifier circuit is a CMOS inverter circuit with a cascode connection including: a first NMOS transistor; a second NMOS transistor whose source is connected to a drain of the first NMOS transistor by the cascode connection; and a first PMOS transistor whose drain is connected to a drain of the second NMOS transistor.

6. The optical communication device according to claim 5, wherein
the CMOS inverter circuit with the cascode connection further includes a first peaking inductor inserted between a drain of the first PMOS transistor and the drain of the second NMOS transistor.

7. The optical communication device according to claim 1, wherein
the first level-shift circuit is a source follower circuit including a first variable current source whose current value is adjusted in accordance with the first control signal, and
the first amplifier circuit is a grounded-source amplifier circuit including: a third NMOS transistor; and a first resistance connected to a drain of the third NMOS transistor.

8. The optical communication device according to claim 1, wherein
the first level-shift circuit is a source follower circuit including a first variable current source whose current value is adjusted in accordance with the first control signal, and
the first amplifier circuit is a grounded-source amplifier circuit with a cascode connection including: a fourth NMOS transistor; a fifth NMOS transistor whose source is connected to a drain of the fourth NMOS transistor by the cascode connection; and a second resistance whose one end is connected to a drain of the fifth NMOS transistor.

9. The optical communication device according to claim 8, wherein
the grounded-source amplifier circuit with the cascode connection further includes a second peaking inductor inserted between the one end of the second resistance and the drain of the fifth NMOS transistor.

10. An optical communication device comprising:
a pre-amplifier circuit including an input node to which a current signal from a photodiode is inputted and an output node, and amplifying a current signal from the input node, converting an amplified signal into a voltage signal, and outputting a converted signal to the output node;
a post-amplifier circuit connected to a subsequent stage of the pre-amplifier circuit, and differentially amplifying an output signal from the pre-amplifier circuit; and
a first controller circuit supplying a control signal to the pre-amplifier circuit and the post-amplifier circuit,
the pre-amplifier circuit including:
a first level-shift circuit provided on a first path between the input node and the output node, and level-shifting a voltage level of a signal inputted via the input node by an amount in accordance with a first control signal;
a first amplifier circuit connected to a subsequent stage of the first level-shift circuit on the first path, and amplifying an output signal of the first level-shift circuit with a negative gain and outputting an amplified signal to the output node; and
a feedback resistance provided on a second path connected in parallel to the first path between the input node and the output node,
the first controller circuit including:
a replica circuit having a replica of the first amplifier circuit, with an input and an output thereof being electrically connected to each other;
a first current source generating the same direct current as a direct current level of a current signal from the photodiode;
a replica pre-amplifier circuit configured as a replica of the pre-amplifier circuit, and performing an amplifying operation with taking the direct current from the first current source as an input; and
a second amplifier circuit performing an amplifying operation with taking an input signal of the first amplifier circuit in the replica pre-amplifier circuit and an output signal of the replica circuit as its differential input, and outputting the first control signal,
the first level-shift circuit in the pre-amplifier circuit and the first level-shift circuit in the replica pre-amplifier circuit being operated by receiving the first control signal, and
the post-amplifier circuit differentially amplifying a voltage of the output node in the pre-amplifier circuit with taking a voltage of the output node in the replica pre-amplifier circuit as a reference.

11. The optical communication device according to claim 10, wherein
the post-amplifier circuit is configured by a differential amplifier circuit having a plurality of stages, and
at least one stage of the differential amplifier circuit having the plurality of stages includes an inductor to increase a gain in a high frequency region.

12. The optical communication device according to claim 10, wherein
a feedback path including an offset correction circuit is further provided between an input and an output of the post-amplifier circuit,
the offset correction circuit includes:
a low pass filter circuit filtering an output signal of the post-amplifier circuit, and including a first resistance and a first capacitance; and
a third amplifier circuit amplifying an output signal of the low pass filter, and feeding an amplified signal back to the input of the post-amplifier circuit, and
the first capacitance is connected between an input and an output of the third amplifier circuit.

13. An optical communication device comprising:
a grounded-gate amplifier circuit and a grounded-source amplifier circuit amplifying a current signal from a photodiode which is inputted from a first node, and converting an amplified signal into a voltage signal; and
a source follower circuit connected to a subsequent stage of the grounded-gate amplifier circuit and the grounded-source amplifier circuit,
the grounded-gate amplifier circuit including:
a first MIS transistor with a first conductive type whose source is connected to the first node;
a second MIS transistor with the first conductive type whose source is connected to a drain with the first MIS transistor by a cascode connection;
a first resistance whose one end is connected to a drain of the second MIS transistor; and
a first current source connected to the first node, the grounded-source amplifier circuit including:
a third MIS transistor with the first conductive type whose gate is connected to the first node;
a fourth MIS transistor with the first conductive type whose source is connected to a drain of the third MIS transistor by a cascode connection and whose drain is connected to a gate of the first MIS transistor; and
a second resistance whose one end is connected to a drain of the fourth MIS transistor,
the source follower circuit including:
a fifth MIS transistor with the first conductive type whose gate is connected to a drain of the second MIS transistor; and
a second current source connected to a source of the fifth MIS transistor.

14. The optical communication device according to claim 13, wherein
the grounded-source amplifier circuit further includes an inductor, and
a drain of the fourth MIS transistor is connected to a gate of the first MIS transistor and one end of the second resistance via the inductor.

* * * * *